(12) United States Patent
Xue et al.

(10) Patent No.: US 10,382,015 B2
(45) Date of Patent: Aug. 13, 2019

(54) PHASE-TUNING OSCILLATORS

(71) Applicant: City University of Hong Kong, Kowloon (HK)

(72) Inventors: Quan Xue, Tai Po (HK); Liang Wu, Tai Wai (HK)

(73) Assignee: City University of Hong Kong, Kowloon (HK)

( * ) Notice: Subject to any disclaimer, the term of this patent is extended or adjusted under 35 U.S.C. 154(b) by 229 days.

(21) Appl. No.: 15/611,496

(22) Filed: Jun. 1, 2017

(65) Prior Publication Data

US 2018/0351510 A1 Dec. 6, 2018

(51) Int. Cl.
  *H03B 5/12* (2006.01)
  *H03K 3/03* (2006.01)
  *H03B 27/00* (2006.01)

(52) U.S. Cl.
  CPC ......... *H03K 3/0315* (2013.01); *H03B 5/1215* (2013.01); *H03B 5/1228* (2013.01); *H03B 27/00* (2013.01); *H03B 2200/0074* (2013.01)

(58) Field of Classification Search
  CPC .. H03K 3/0315; H03B 5/1215; H03B 5/1212; H03B 5/1228; H03B 27/00; H03B 2200/0074
  See application file for complete search history.

(56) References Cited

U.S. PATENT DOCUMENTS

| | | | | |
|---|---|---|---|---|
| 2004/0266380 | A1* | 12/2004 | Ravi | H03B 5/14 455/205 |
| 2011/0298549 | A1* | 12/2011 | Luong | H03B 5/24 331/57 |
| 2013/0163689 | A1* | 6/2013 | Diao | H03C 3/00 375/279 |
| 2014/0084971 | A1* | 3/2014 | Kuo | H03B 19/00 327/119 |

OTHER PUBLICATIONS

Razavi, B. "A Study of Injection Locking and Pulling in Oscillators," IEEE J. Solid-State Circuits, vol. 39, No. 9, pp. 1415-1424, Sep. 2004, 10 pages.

(Continued)

*Primary Examiner* — Jeffrey M Shin
(74) *Attorney, Agent, or Firm* — Norton Rose Fulbright US LLP

(57) ABSTRACT

Systems and methods which provide oscillator configurations implementing phase rotation (rotated-phase-tuning (RPT)) are described. Embodiments of a RPT oscillator may employ phase interpolation, whereby two current vectors having different phases are superimposed to provide a resultant current vector having a tunable phase to vary a phase shift in a feedback loop of an oscillator circuit and correspondingly tune the oscillation frequency. Phase rotation provided by an RPT oscillator configuration of embodiments inserts a negative phase shift (rotation phase shift) into each of two current branches to rotate the phase shifts of a phase-tuning technique, such as for avoiding phase ambiguity with respect to tunable oscillation frequencies.

(Continued)

RPT oscillators of embodiments are varactor-less and are particularly well suited for operation to provide output frequencies in the millimeter-wave (mmW) band.

29 Claims, 14 Drawing Sheets

(56) References Cited

OTHER PUBLICATIONS

Van der Tang, J. et al. "Analysis and Design of an Optimally Coupled 5-GHz Quadrature LC Oscillator," IEEE J. Solid-State Circuits, vol. 37, No. 5, pp. 657-661, May 2002, 5 pages.
Wang, H. et al. "A Wideband CMOS Linear Digital Phase Rotator," IEEE Custom Intergrated Circuits Conf., pp. 671-674, 2007, 4 pages.
Mirzaei, a. et al. "The Quadrature LC Oscillator: A Complete Portrait Based on Injection Locking," IEEE J. Solid-State Circuits, vol. 42, No. 9, pp. 1916-1932, Sep. 2007, 17 pages.
Andreani, P. et al. "Analysis and Design of a 1.8-GHz CMOS LC Quadrature VCO," IEEE J. Solid-State Circuits, vol. 37, No. 12, pp. 1737-1747, Dec. 2002, 11 pages.
Han, R. et al. "A CMOS High-Power Broadband 260-GHz Radiator Array for Spectroscopy," IEEE J. Solid-State Circuits, vol. 48, No. 12, pp. 3090-3104, Dec. 2013, 15 pages.
Andreani, P. et al. "On the Phase-Noise and Phase-Error Performances of Multiphase LC CMOS VCOs," IEEE J. Solid-State Circuits, vol. 39, No. 11, pp. 1883-1893, Nov. 2004, 11 pages.
Leeson, D.B. "A Simple Model of Feedback Oscillator Noise Spectrum," Proc. IEEE, vol. 54, No. 2, pp. 329-330, Feb. 1966, 2 pages.
Rong, S. et al. "Design and Analysis of Varactor-Less Interpolative-Phase-Tuning Millimeter-Wave LC Oscillators with Multiphase Outputs," IEEE J. Solid-State Circuits, vol. 46, No. 8, pp. 1810-1819, Aug. 2011, 10 pages.
Hajimiri, A. et al. "A General Theory of Phase Noise in Electrical Oscillators," IEEE J. Solid-State Circuits, vol. 33, No. 2, pp. 179-194, Feb. 1998, 16 pages.
Soltanian, B. et al. "An Ultra Compact Differentially Tuned 6 GHz CMOS LC VCO With Dynamic Common-Mode Feedback," IEEE J. Solid-State Circuits, vol. 42, No. 8, pp. 1635-1641, Aug. 2007, 4 pages.
Decanis, U. et al. "A Low-Noise Quadrature VCO Based on Magnetically Coupled Resonators and a Wideband Frequency Divider at Millimeter Waves," IEEE J. Solid-State Circuits, vol. 46, No. 12, pp. 2943-2955, Dec. 2011, 13 pages.
Wu, L. et al. "A 49-to-62 GHz Quadrature VCO with Bimodal Enhanced-Magnetic-Tuning Technique," IEEE Trans. Circuits Syst. I, Reg. Papers, vol. 61, No. 10, pp. 3025-3033, Oct. 2014, 9 pages.
Lu, T.Y. et al. "Wide Tunning Range 60 GHz VCO and 40 GHz DCO Using Single Variable Inductor," IEEE Trans. Circuits Syst. I, Reg. Papers, vol. 60, No. 2, pp. 257-267, Feb. 2013, 11 pages.
W. Fei et al. "Design and Analysis of Wide Frequency-Tuning-Range CMOS 60 GHz VCO by Switching Inductor Loaded Transformer," IEEE Trans. Circuits Syst. I, Reg. Papers, vol. 61, No. 3, pp. 699-711, 2014, 13 pages.
Yin, J. et al. "A 57.5-90.1-GHz Magnetically Tuned Multimode CMOS VCO," IEEE J. Solid-State Circuits, vol. 48, No. 8, pp. 1851-1861, Aug. 2013, 11 pages.
Vigilante, M. et al. "An E-Band Low-Noise Transformer-Coupled Quadrature VCO in 40 nm CMOS," Proc. of European Solid-State Circuits Conference, pp. 423-426, 2014, 4 pages.
Liu, X. et al. "Transformer-Based Varactor-Less 96GHz-110GHz VCO and 89GHz-101GHz QVCO in 65nm CMOS," IEEE Asian Solid-State Circuits Conference, pp. 357-360, Nov. 2016, 4 pages.
Nasr, I. et al. "A 70-90-GHz High-Linearity Multi-Band Quadrature Receiver in 0.35μm SiGe Technology," IEEE Trans. Microw. Theory Tech., vol. 61, No. 12, pp. 4600-4612, Dec. 2013, 13 pages.
Huang, Z. et al. "A 70.5-to-85.5GHz 65nm Phase-Locked Loop with Passive Scaling of Loop Filter," IEEE Int. Solid-State Circuit Conference Dig. Tech. Papers, pp. 448-450, 2015, 3 pages.

* cited by examiner

PHASE-TUNING OSCILLATORS

TECHNICAL FIELD

The invention relates generally to oscillator circuits and, more particularly, to providing variable oscillation frequencies using phase-tuning techniques, including rotated-phase-tuning techniques.

BACKGROUND OF THE INVENTION

The use of radio frequency (RF) signals, such as for providing wireless communication of voice, images, and data, for use in imaging, to provide sensing, etc., is commonplace to the point of nearly becoming ubiquitous. Due to various reasons, such as the availability of relatively unused spectrum, radiation providing penetration of a wide variety of materials, etc., the use of RF signals at higher and higher frequencies has become of interest. For example, the RF frequencies in the millimeter-wave (mmW) band are gaining increasing interest, such as for use with respect to the ever-increasing demands for high-data-rate wireless communication, radar sensing and imaging, etc. Various configurations of mmW transceiver systems useful in one or more of the foregoing applications may, for example, be developed using mainstream complementary metal-oxide-semiconductor (CMOS) technologies, such as due to CMOS devices generally having desirable characteristics including high noise reliability, low static power consumption, and low cost.

A local oscillator (LO) signal is often indispensable in the above transceiver configurations for performing frequency conversion between the RF and the baseband. Generally, the LO frequency is required to be tunable to accommodate various operating channels and the phase noise should be sufficiently low to negligibly deteriorate the signal-to-noise ratio (SNR). Accordingly, the LO signal may be provided by variable frequency oscillator circuit configurations, such as voltage controlled oscillator (VCO) configurations.

To address the performance requirements of mmW VCOs, various topologies and techniques have been developed for mmW LO generation. In particular, directly synthesizing the LO signal based on a VCO oscillating at the desired frequency is currently recognized as one of the optimal choices due to its large output swing, continuous frequency coverage, and the simplicity for system integration. However, circuit design and implementation of a VCO in CMOS suitable for such direct LO signal synthetization remains a major challenge, especially considering that a wide frequency range is typically required to tolerate process, voltage, and temperature (PVT) variations. The quality factor of tuning varactors is predominantly low at mmW frequencies, which directly results in phase noise degradation. Enlarging the VCO transistors and consuming more power could increase the oscillation amplitude and thus improve the phase noise, although the corresponding increase in induced parasitic capacitance would in turn narrow down the tunable frequency range of the VCO. Moreover, if multiple-phase output were to be provided, the situation would worsen due to the additional loading from the coupling devices.

Recently, frequency tuning techniques for mmW VCOs have included techniques based on switched inductors or transformers to vary the effective inductance in the inductance and capacitance (LC) tank and thus to achieve wide frequency tuning range. However, such techniques continue to require low-Q varactors in the VCO to continuously fine-tune the frequency. Moreover, the phase noise at certain frequency ranges is poor, limiting the achievable figure-of-merit (FoM) for VCOs using these frequency tuning techniques. If multi-phase oscillator were provided using these frequency tuning techniques, these techniques would inevitably experience performance degradation due to the more parasitics presented.

BRIEF SUMMARY OF THE INVENTION

The present invention is directed to systems and methods which provide oscillator configurations implementing phase-tuning (PT) techniques for providing oscillation frequency tuning. For example, oscillators implementing PT techniques (PT oscillators) of embodiments of the present invention employ phase interpolation, whereby two current vectors having different phases are superimposed to provide a resultant current vector having a tunable phase. In operation of a PT oscillator of embodiments, such phase interpolation may be utilized to provide a tuning phase shift in a feedback loop of a differential oscillator circuit and correspondingly tune the oscillation frequency of the oscillator. PT oscillator implementations of embodiments may thus comprise a cross-coupled transistor pair and differential transistor pair oscillator configuration in which a plurality of independently controlled current sources may be used to provide a tuning phase shift for oscillation frequency tuning.

PT oscillator implementations of some embodiments of the invention may further utilize phase rotation (rotated-phase-tuning (RPT)), such as for avoiding phase ambiguity with respect to tunable oscillation frequencies. For example, oscillators implementing RPT techniques (RPT oscillators) of embodiments of the present invention may comprise rotation phase shifts inserted in the current branches of the cross-coupled transistor pair and the differential transistor pair used in implementing a PT technique.

Embodiments of a PT oscillator, including RPT oscillators, are varactor-less and are particularly well suited for operation to provide oscillation frequencies in the millimeter-wave (mmW) band. For example, oscillator implementations of embodiments may have no varactors in an inductance and capacitance (LC) tank thereof, whereby oscillation frequency tuning purely relies on phase-tuning techniques according to concepts herein.

PT oscillators, including RPT oscillators, of the present invention may be utilized in various scenarios, such as certain direct-conversion architectures, communication systems utilizing phased arrays, etc., wherein multiple phases are desired. Accordingly, oscillators of embodiments of the invention may be configured to provide multi-phase output, such as to support direct-conversion architectures which are advantageous in terms of simplicity, image-free and low power, to enable phased-arrays employed for link budget improvement and beam-steering at mmW, etc. For example, multiple RPT oscillator cells may be cascaded together to provide stages of an N-stage LC-based RPT ring oscillator implementation. Each RPT oscillator cell may comprise a cross-coupled transistor pair and a differential transistor pair oscillator configuration providing oscillation frequency tuning in accordance with the concepts herein.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1A:
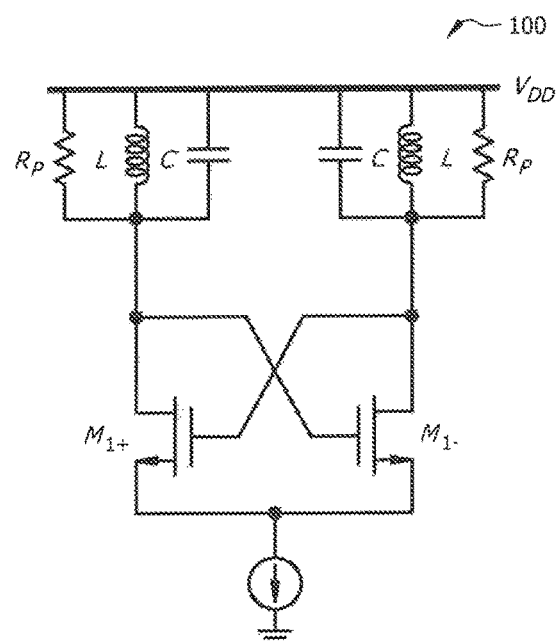
FIG. 1A shows a conventional differential LC oscillator implementation.
Figure 1B:
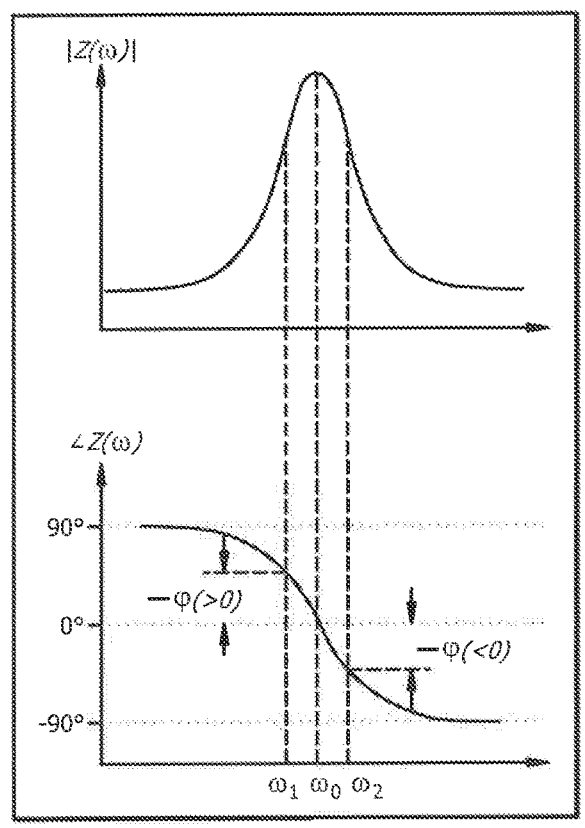
FIG. 1B shows the magnitude and the phase of the differential LC tank of the differential LC oscillator of FIG. 1A.

FIG. 1A shows a conventional differential inductance and capacitance (LC) based oscillator implementation as differential oscillator 100. It should be understood that stable oscillation of the differential LC oscillator of the illustrated example requires the negative transconductance of the cross-coupled transistor pair ($M_{1+}$ and $M_{1-}$) to be sufficient to compensate the tank loss represented by $R_P$. In particular, this is the gain condition and an underlying phase condition is automatically satisfied when the oscillation frequency is derived. By treating the differential oscillator as a feedback loop composed of two single-ended inverting buffers, the phase condition that the total phase shift along the loop should be 360° becomes apparent. Since each of the cross-coupled transistors ($M_{1+}$ and $M_{1-}$) has a 180° phase difference between their output current and input voltage, the LC tank is required to contribute 0° phase shift, resulting in oscillation at the resonance frequency (i.e., $\omega_0=1/\sqrt{LC}$). This relationship is illustrated by the impedance graphs of FIG. 1B.

From the foregoing, it can be appreciated that tuning of the oscillation frequency of differential oscillator 100 may be implemented by varying either L or C to shift the resonance frequency of the LC tank. Although this technique for oscillation frequency tuning of a conventional differential LC oscillator has commonly been employed, the technique inevitably suffers from a number of drawbacks, particularly with respect to use at millimeter-wave (mmW) frequencies. For example, phase noise may be significantly degraded when the differential oscillator configuration of FIG. 1A is utilized at mmW frequencies due to the quality factor of tuning varactors (e.g., voltage-controlled capacitors commonly used in VCOs) being predominantly low at mmW frequencies. Although enlarging the VCO transistors and consuming more power could increase the oscillation amplitude and thus improve the phase noise, the corresponding increase in induced parasitic capacitance would in turn narrow the tunable frequency range of the VCO.

Figure 1C:
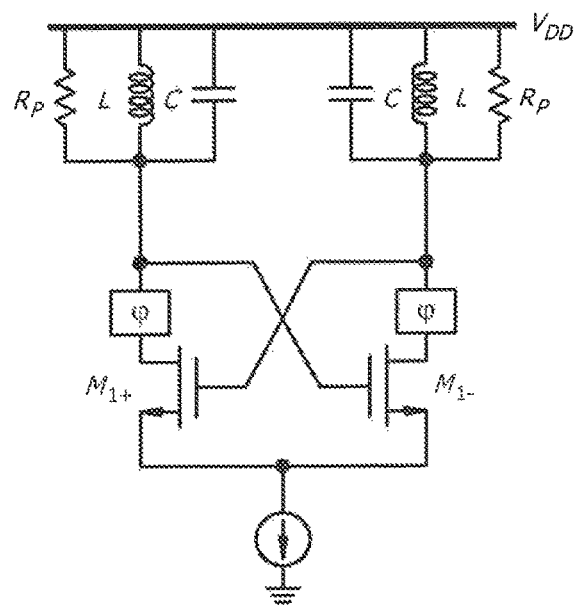
FIG. 1C shows a configuration of a differential LC oscillator in which a phase shift is inserted in series with the LC tank.

Analysis indicates that the oscillation frequency of a differential oscillator configuration, such as differential oscillator 100 illustrated in FIG. 1A, changes along with phase shift in the loop. As shown in FIG. 1C, if a phase shift ($\varphi$) is inserted in series with the LC tank of a differential oscillator configuration, the LC tank should provide a phase of $-\varphi$ to compensate $\varphi$. If the LC tank provides $-\varphi$ phase shift, the circuit will oscillate at a frequency other than $\omega_0$, assuming the gain condition can be still fulfilled (see e.g., B. Razavi, "A Study of Injection Locking and Pulling in Oscillators," *IEEE J. Solid-State Circuits*, vol. 39, no. 9, pp. 1415-1424, September 2004, the disclosure of which is incorporated herein by reference). However, continuous frequency coverage may be obtained by properly tuning the phase shift $\varphi$, wherein the range of the frequency coverage would be proportional to the span of the variable phase shift. Accordingly, embodiments of the present invention provide oscillator configurations in which variable phase shift is implemented using a phase-tuning (PT) technique for providing output frequency tuning. Embodiments of an oscillator implementing a PT technique (PT oscillator) are variactor-less (e.g., are implemented without the use of voltage-controlled capacitors and/or inductors for providing frequency tuning), such as through use of a cross-coupled transistor pair and differential transistor pair oscillator configuration.

In understanding PT oscillator operation according to concepts of the preset invention, it is helpful to analyze the variable tuning phase shift used in accordance with PT techniques of embodiments. From the graphs of FIG. 1B it can be appreciated that the impedance magnitude of the LC tank decreases as the oscillation frequency gradually deviates from the resonance frequency $\omega_0$. In particular, the equivalent quality factor of the LC tank can be approximated as:

$$Q \approx Q_0 \cdot \cos \varphi \quad (1)$$

where $Q_0$ denotes the intrinsic quality factor at $\omega_0$ (see J. van der Tang, P. van de Ven, D. Kasperkovitz, and A. van Roermund, "Analysis and Design of An Optimally Coupled 5-GHz Quadrature LC Oscillator," *IEEE J. Solid-State Circuits*, vol. 37, no. 5, pp. 657-661, May 2002, the disclosure of which is incorporated herein by reference). As $|\varphi|$ increases and approaches 90°, both the output amplitude and the phase noise of the oscillator will be severely degraded if the oscillation does not diminish. Therefore, depending on the tolerable performance degradation, an upper limit should be imposed on the variable tuning phase range $|\varphi|$, yielding a finite oscillation frequency tuning range. In other words, when designing the variable tuning phase shift according to embodiments of the invention, there is a performance trade-off between the phase noise and the oscillation frequency tuning range.

Figure 2:
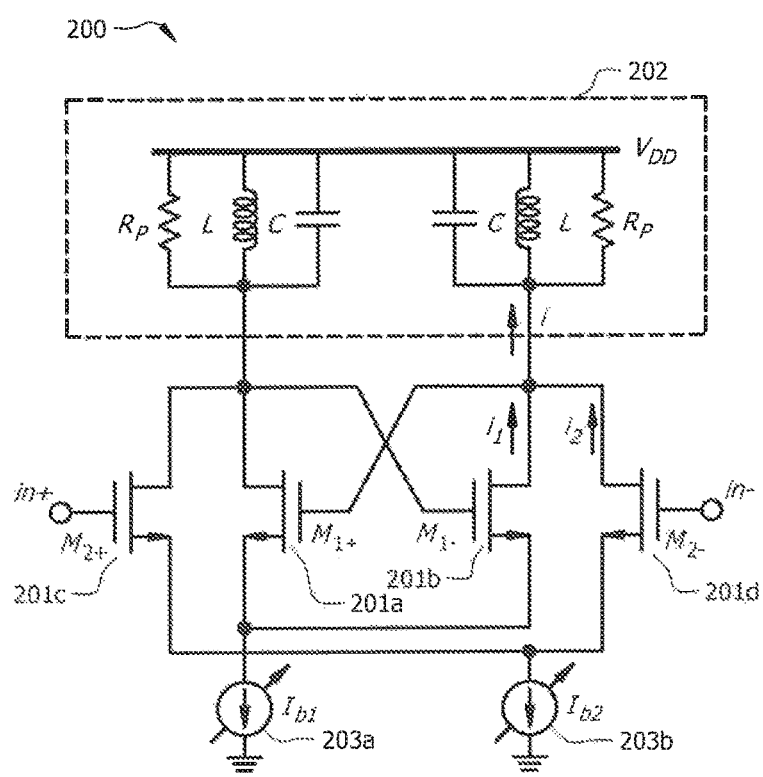
FIG. 2 shows an LC-based PT oscillator configuration in accordance with embodiments of the present invention.

To facilitate a circuit implementation of the variable tuning phase shift for providing oscillation frequency tuning according to the concepts herein, phase interpolation may be employed to vary the tuning phase shift of the PT technique (see H. Wang, and A. Hajimiri, "A Wideband CMOS Linear Digital Phase Rotator," *IEEE Custom Integrated Circuits Conf.*, pp. 671-674, 2007, the disclosure of which is incorporated herein by reference). In accordance with such phase interpolation, two existing vectors (e.g., current vectors having phase and amplitude components) are superimposed with different phases ($\Delta\theta \leq 90°$) and their amplitude ratio controlled such that the resulted vector has a tunable phase, thus providing a variable tuning phase shift according to embodiments. It should be appreciated that the cross-coupled transistor pair ($M_{1+}$ and $M_{1-}$) in the conventional differential LC oscillator topology may be utilized to contribute one differential current branch (i.e., a first current vector, $i_1$, for use in phase interpolation). Accordingly, embodiments of a PT oscillator configuration add a differential pair of transistors ($M_{2+}$ and $M_{2-}$) in parallel with the cross-coupled transistor pair ($M_{1+}$ and $M_{1-}$) to generate the other differential current branch (i.e., a second current vector, $i_2$, for use in phase interpolation), as shown in example circuit implementation of FIG. 2 as PT oscillator 200.

Embodiments of PT oscillator 200 may, for example, comprise a cross-coupled transistor pair ($M_{1+}$ and $M_{1-}$) provided by transistors 201a and 201b and a differential pair of transistors ($M_{2+}$ and $M_{2-}$) provided by transistors 201c and 201d, wherein the transistors may be metal-oxide-semiconductor field-effect transistors (MOSFETs), such as may be formed using CMOS technologies. In a PT oscillator implementation according to embodiments of the invention, the aforementioned cross-coupled transistor pair and differential transistor pair each comprise a pair of matched transistors.

LC tank 202 of PT oscillator 200 of the illustrated embodiment comprises inductors (L) and capacitors (C). The inductors may be formed by on-chip spirals, transmission lines, etc. while the capacitors may be formed by metal-insulator-metal (MIM) capacitors, metal-oxide-metal (MOM) capacitors, the parasitic capacitors of the transistors and routing wires, etc. In a PT oscillator implementation according to embodiments of the invention, the inductor and/or capacitors of the LC tank comprise fixed, non-variable (e.g., non-variactor) inductive and capacitive components. As shown in the illustrated example of PT oscillator 200, LC tank 202 may further be characterized by including a tank loss, shown as $R_P$.

In operation of PT oscillator 200, the two differential currents (i.e., $i_1$ and $i_2$) are superposed (i.e., providing resultant current i) and injected into the LC tank. Accordingly, tail currents $I_{b1}$ and $I_{b2}$ may be tuned (e.g., using variable current sources 203a and 203b) to vary the transconductance of the cross-coupled transistor pair ($M_{1+}$ and $M_{1-}$) and the differential transistor pair ($M_{2+}$ and $M_{2-}$), respectively, providing amplitude-ratio control and thus phase interpolation for providing a tuning phase shift of a PT technique. The above mentioned current sources may, for example, be implemented by using a MOSFET and biasing it to operate in the saturation region. A challenge, however, is presented with respect to supplying the differential transistor pair ($M_{2+}$ and $M_{2-}$) with a voltage signal which has exactly the same frequency but a different phase compared to the output voltage.

Figure 3A:
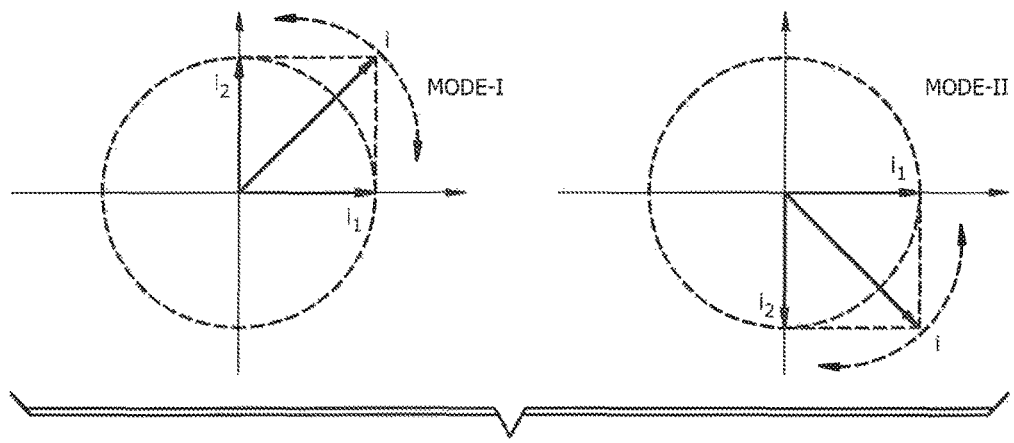
FIGS. 3A and 3B show phasor diagrams for two oscillation modes of the PT oscillator of FIG. 2.
Figure 3B:
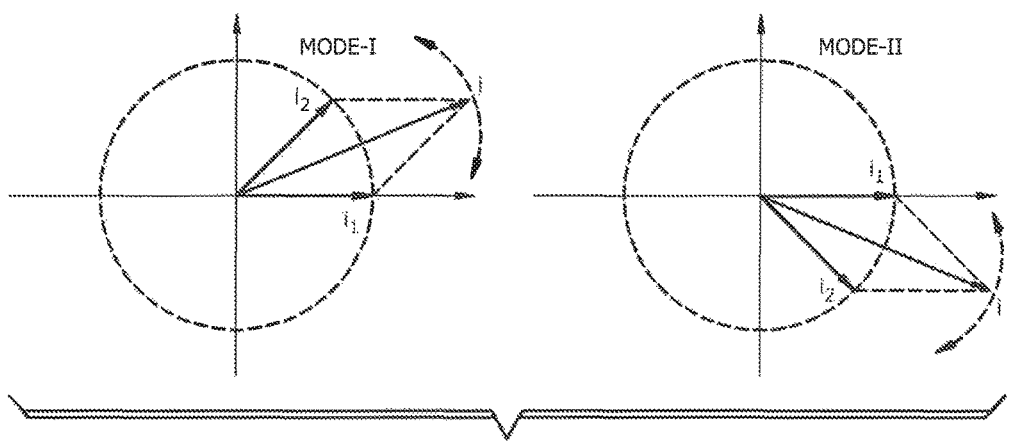

Embodiments of a PT oscillator are configured to supply the differential transistor pair ($M_{2+}$ and $M_{2-}$) with a voltage signal which has the same frequency but a different phase compared to the output voltage by connecting multiple oscillator cells together as multiple stages to form an N-stage LC-based ring oscillator. However, it should be appreciated that, in a multiple stage configuration of a PT oscillator implementation, a phase difference exists between the input voltage to the differential transistor pair ($M_{2+}$ and $M_{2-}$) and the output voltage in each stage. In particular, the phase difference $\Delta\varphi$ is either 180°/N or −180°/N, corresponding to two oscillation modes (Mode-I and Mode-II, respectively). Phasor diagrams, in the current domain, for multiple stage (N-stage) PT oscillator implementations for N=2 and N=4 are shown in FIGS. 3A and 3B, respectively. In particular, FIG. 3A shows phasor diagrams for oscillation modes Mode-I and Mode-II when the phase difference $\Delta\varphi$ is ±90° (i.e., 180°/2) and FIG. 3B shows phasor diagrams for oscillation modes Mode-I and Mode-II when the phase difference $\Delta\varphi$ is ±45° (i.e., 180°/4).

As can be appreciated from the foregoing, the oscillation frequency of PT oscillator 200 may be varied through operation of the aforementioned PT approach based on phase interpolation providing a tuning phase shift. However, the oscillation frequency tuning range of such a PT oscillator implementation is limited in each of the two oscillation modes. For example, the variable phase range is bounded by the degradation of output amplitude and phase noise, as previously discussed. Moreover, the maximum achievable tuning phase shift cannot exceed the phase difference $\Delta\theta$ due to the phase-interpolation approach used. As a further consideration, the magnitude of the interpolated current is the same for the two oscillation modes, and ideally the LC tank is symmetrical in terms of amplitude and phase response, and thus predicting which oscillation mode (i.e., Mode-I or Mode-II) the PT oscillator circuit of the exemplary implementation of FIG. 2 will operate at is problematic. Therefore, a phase ambiguity issue may exist with respect to operation of the exemplary PT oscillator circuit (see A. Mirzaei, M. E. Heidari, R. Bagheri, S. Chehrazi, and A. A. Abidi, "The Quadrature LC Oscillator: A Complete Portrait Based on Injection Locking," *IEEE J. Solid-State Circuits*, vol. 42, no. 9, pp. 1916-1932, September 2007 and P. Andreani, A. Bonfanti, L. Romano, and C. Samori, "Analysis and design of a 1.8-GHz CMOS LC quadrature VCO," *IEEE J. Solid-State Circuits*, vol. 37, no. 12, pp. 1737-1747, December 2002, the disclosures of which are incorporated by reference). If PT oscillator 200 were to be restricted to mono-mode operation, however, the single polarity of the tuning phase shift due to mono-mode operation would confine the oscillation frequency within either the lower or the higher side near the peak frequency $\omega_0$.

In order to optimize the oscillation frequency tuning range and to mitigate the performance trade-off, the above limiting factors are addressed in PT oscillator implementations implementing rotated-phase-tuning (RPT) of embodiments herein. In a PT oscillator implementing RPT techniques (RPT oscillator) of embodiments, the phase difference $\Delta\theta$ utilized in providing the tuning phase shift is reasonably large so as not to present a bottleneck for the variable tuning phase shift range, such as through optimizing the number of stages in the multiple stage configuration of an RPT oscillator implementation. In conjunction with other considerations, including layout symmetry and routing complexity for practical implementation, an optimal stage number (N) utilized according to some embodiments is either 2 or 4, yielding $|\Delta\theta|$ equal to 90° and 45°, and output phases of 4 and 8, respectively.

Further, in an RPT oscillator implementation of embodiments, the variable tuning phase shift range is maximized to widen the oscillation frequency tuning range and the negative effect on the phase noise is minimized. In particular, the polarity of the tuning phase shift does not affect the equivalent quality factor, and thus the tuning phase shift of an RPT oscillator of embodiments is allowed to be both positive and negative (Mode-I and Mode-II oscillation) to better utilize the available phase difference for a larger variable range without any performance penalty. Embodiments are adapted to implement both positive and negative tuning phase shifts, without resulting phase ambiguity issues, through insertion of a negative phase shift (rotation phase shift) of $\varphi_0$ into each of the two current branches to thereby rotate the phase shifts of the PT technique (i.e., implementing rotated-phase-tuning (RPT) using rotation phase shifts). For example, rotation phase shifts 401a-401d may be provided in the current branches of both the cross-coupled transistor pair ($M_{1+}$ and $M_{1-}$) and the differential transistor pair ($M_{2+}$ and $M_{2-}$), as shown in RPT oscillator 400 of the example circuit implementation of FIG. 4. Detail with respect to implementations of rotation phase shifts 401a-401d according to embodiments of the invention is provided below.

Figure 4:
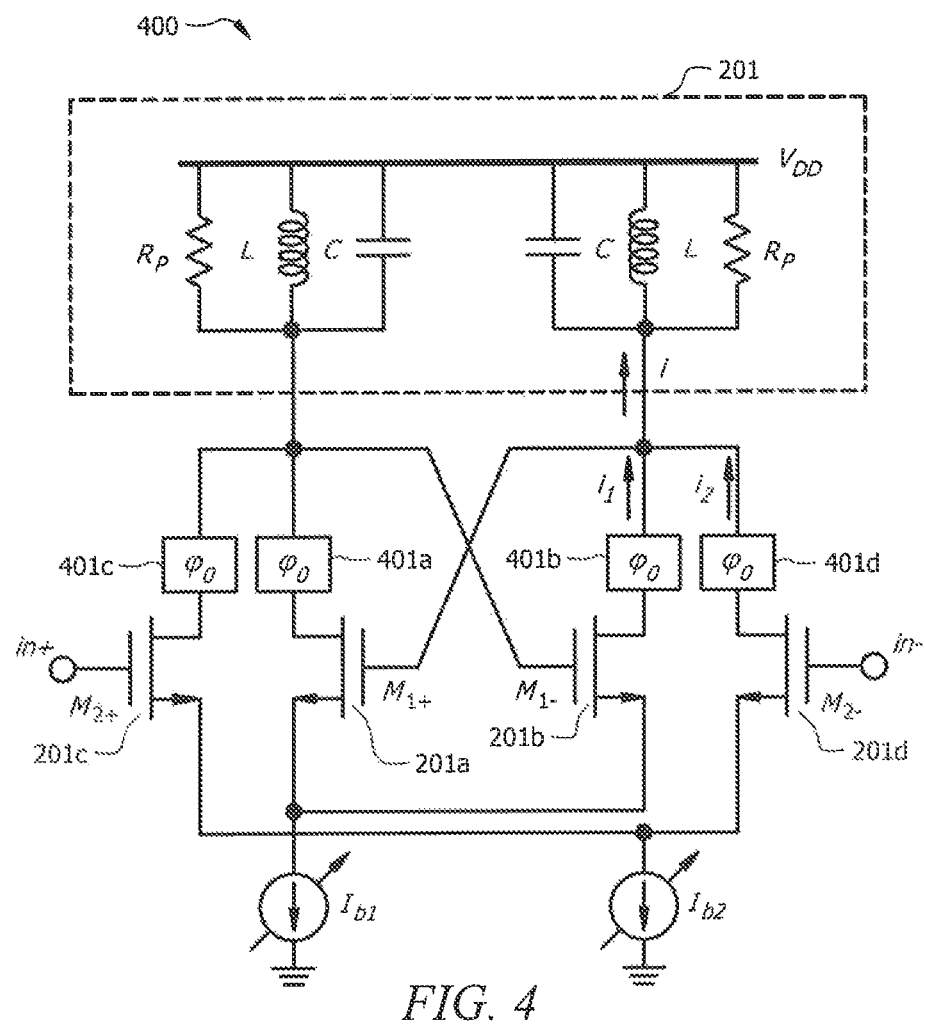
FIG. 4 shows an LC-based RPT oscillator configuration in accordance with embodiments of the invention.
Figure 5A:
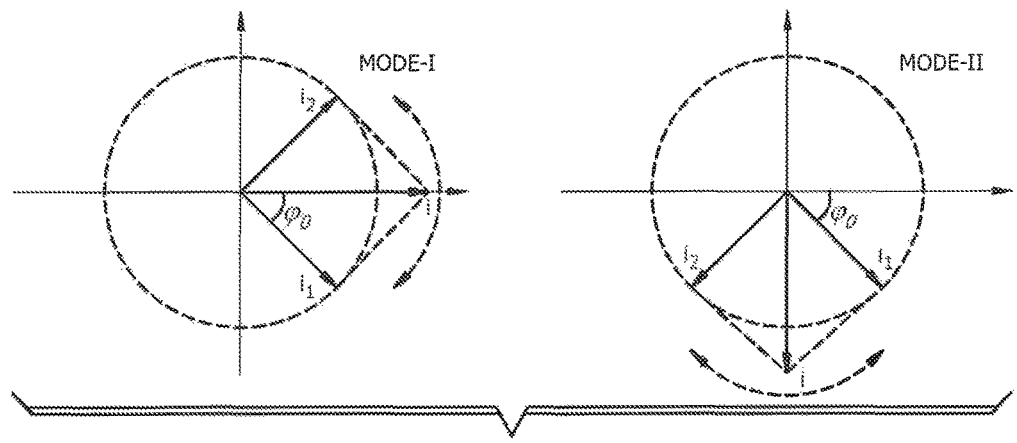
FIGS. 5A and 5B show phasor diagrams for two oscillation modes of the RPT oscillator of FIG. 4.
Figure 5B:
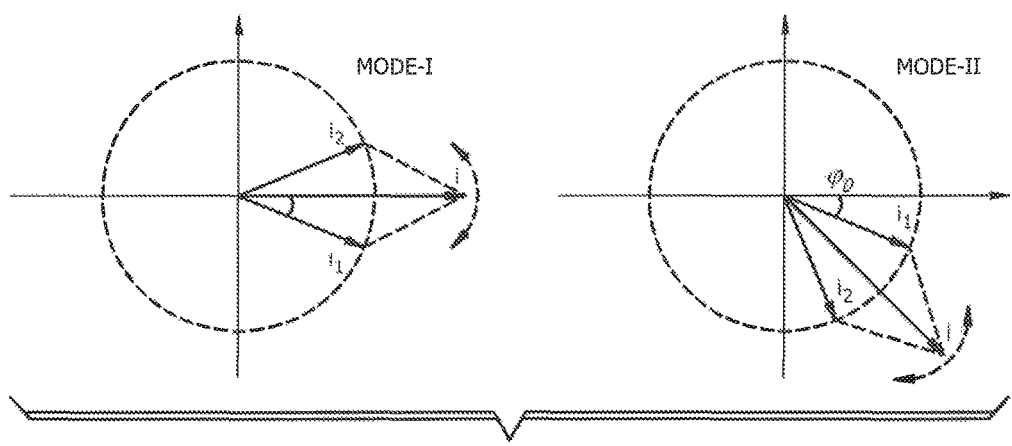

Irrespective of the particular implementation of the rotation phase shifts, however, the phase shift provided by rotation phase shifts 401a-401d of embodiments is designed to be approximately half of the phase difference (i.e., $\varphi_0 \approx -|\Delta\theta|/2$) used in providing the tuning phase shift so that all the current vectors of the PT technique are rotated clockwise. Accordingly, operation of RPT oscillator 400 including rotation phase shifts 401a-401d of embodiments results in the variable tuning phase shift approximately evenly distributed around the impedance peak of the LC tank for Mode-I operation. Phasor diagrams, in the current domain, for multiple stage (N-stage) RPT oscillator implementations for N=2 and N=4 including a negative rotation phase shift of $\varphi_0$ in each of the two current branches, as in RPT oscillator 400 of FIG. 4, are shown in FIGS. 5A and 5B, respectively. In particular, FIG. 5A shows phasor diagrams for oscillation modes Mode-I and Mode-II when the phase difference used in providing the tuning phase shift $\Delta\varphi$ is ±90° (i.e., 180°/2) and the rotation phase shift $\varphi_0$=-45° (i.e., -|90°|/2), whereas FIG. 5B shows phasor diagrams for oscillation modes Mode-I and Mode-II when the phase difference used in providing the tuning phase shift $\Delta\varphi$ is ±45° (i.e., 180°/4) and the rotation phase shift $\varphi_0$=-22.5° (i.e., -|45°|/2). It can be appreciated from the phasor diagrams of FIGS. 5A and 5B that oscillation Mode-II operation is discriminated because the LC tank would have to contribute a larger phase which corresponds to much lower impedance compared with oscillation Mode-I. As such, the phase ambiguity issue is resolved.

The foregoing rotation phase shifts, used to rotate the tuning phase shifts of the PT technique, provided in the current paths of an RPT oscillator of embodiments may be implemented in a number of ways consistent with the concepts of the present invention. For example, phase shifts used in rotating the tuning phase shifts of a PT oscillator may be implemented using different delay lines according to embodiments of the invention. Considering that the rotation phase shift utilized according to embodiments for rotating the tuning phase shift is negative (e.g., $-\varphi_0$ provided by rotation phase shifts 401a-401d), embodiments may utilize delay with respect to MOSFET devices (e.g., transistors 201a-201d implemented as MOSFETs) of RPT oscillator 400 to provide implicit phase shifters. In particular, the MOSFET delay may be notably large at millimeter-wave (mmW) frequencies, thus providing a phase shift suitable for rotating the current vectors according to embodiments of an RPT oscillator herein operable to provide output frequencies in the mmW band.

Figure 6:
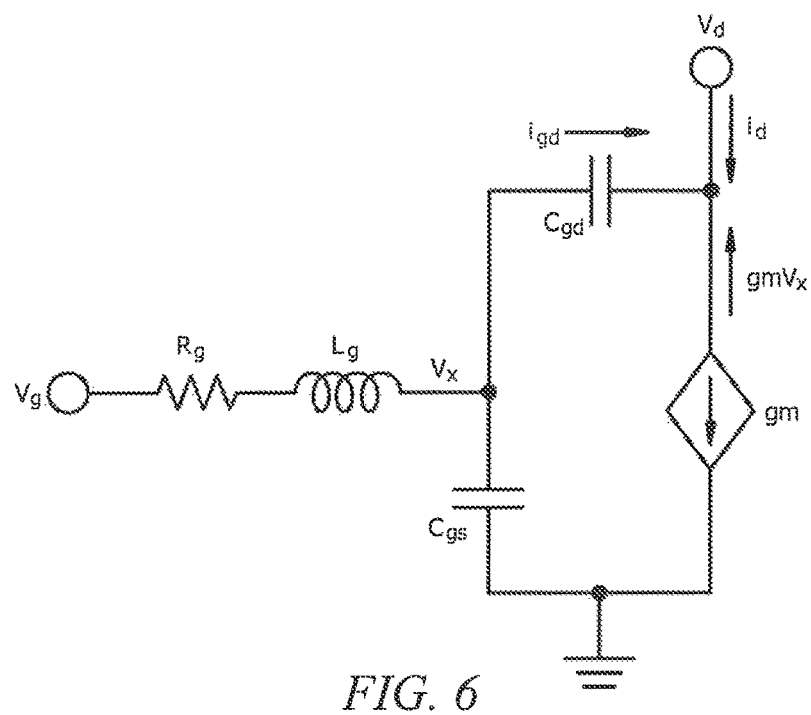
FIG. 6 shows a small-signal model of an NMOS transistor as may be utilized in the cross-coupled transistor pair and the differential transistor pair of oscillators of embodiments of the invention.
Figure 7:
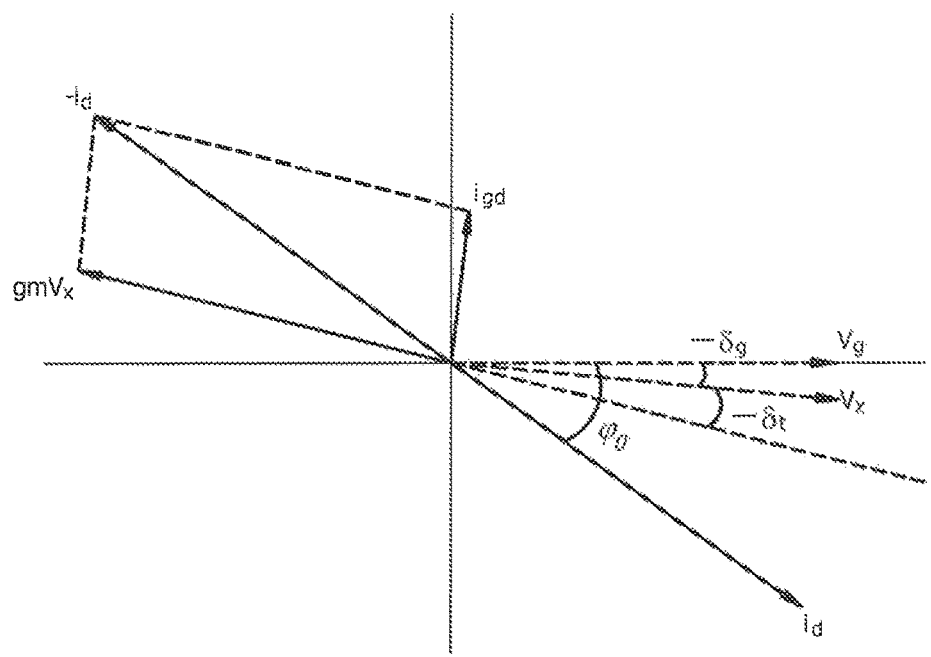
FIG. 7 shows the phase delay between the input gate voltage and the output drain current of the NMOS transistor of FIG. 6.

To aid in understanding the aforementioned delay with respect to MOSFET devices, as may be utilized in providing rotation phase shifts of an RPT oscillator configuration, the small-signal model of an NMOSFET (NMOS) transistor is shown in FIG. 6, see also R. Han and E. Afshari, "A CMOS High-Power Broadband 260-GHz Radiator Array for Spectroscopy," *IEEE J. Solid-State Circuits*, vol. 48, no. 12, pp. 3090-3104, December 2013, the disclosure of which is incorporated herein by reference). As can be appreciated from the small-signal model of FIG. 6, a delay (as may be denoted by $-\delta_g$) exists at the gate of the NMOS transistor due to the parasitic resistance, inductance, and capacitance. Further, when the V-to-I conversion is performed by the transconductance $g_m$ in the main path, the nonzero transit time of the carriers causes another delay (as may be denoted by $-\delta_t$) between the output drain current ($g_m v_x$) and the inner gate voltage $v_x$, see e.g., P. Andreani, A. Bonfanti, L. Romano, and C. Samori, "Analysis and design of a 1.8-GHz CMOS LC quadrature VCO," *IEEE J. Solid-State Circuits*, vol. 37, no. 12, pp. 1737-1747, December 2002). The feedforward current $i_{gd}$ through the gate-to-drain capacitance $C_{gd}$ also contributes some phase shift. Overall, the output current from the drain ($i_d$) of the NMOS transistor is the summation of $i_{gd}$ and $g_m v_x$. The phasor diagram of FIG. 7 shows the phase delay $\varphi_0$ between the input gate voltage and the output drain current of an NMOS transistor corresponding to the small-signal model of FIG. 6.

Figure 8A:
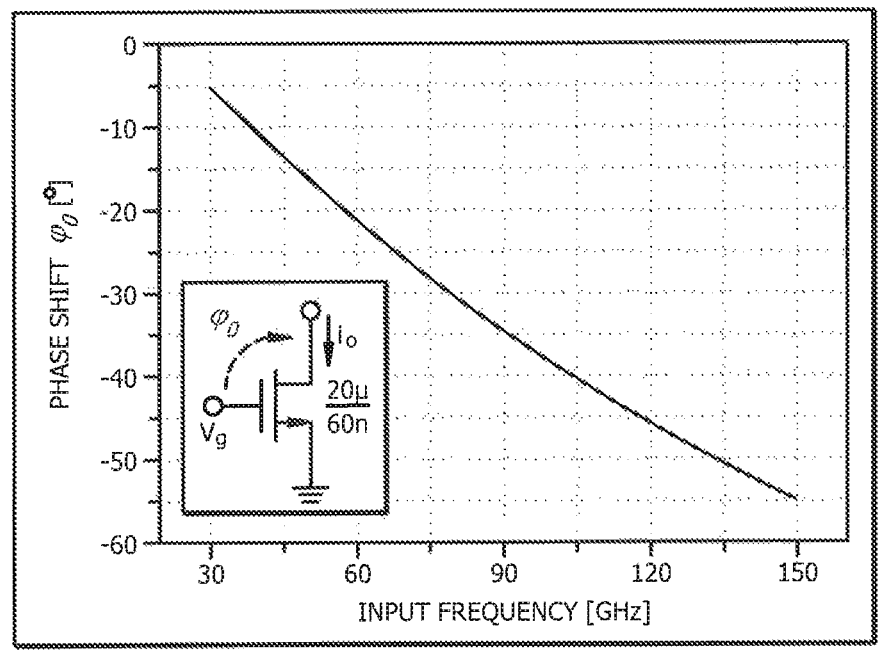
FIGS. 8A and 8B show the simulated phase shift of the NMOS transistor of FIG. 6.
Figure 8B:
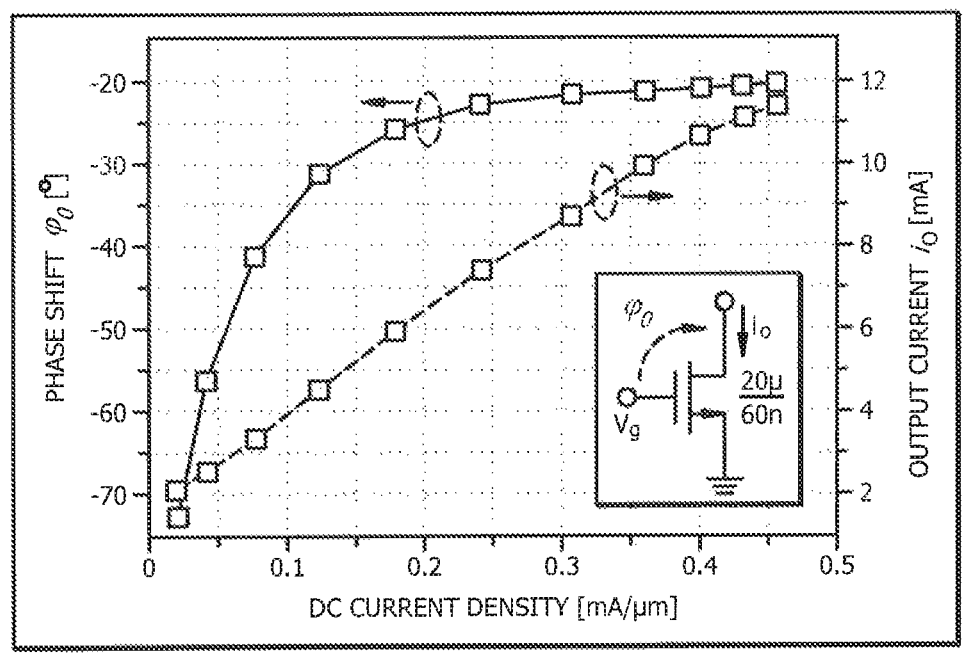

FIGS. 8A and 8B show the simulated (e.g., as may be obtained from SpectreRF simulations) phase shift of an NMOS transistor corresponding to the small-signal model of FIG. 6. In particular, FIG. 8A shows the simulated phase shift versus input frequency for an NMOS transistor when the current density is fixed at 0.15 mA/μm and FIG. 8B shows the simulated phase shift and output alternating current (AC) verses direct current (DC) current density at 77 GHz. It should be appreciated that the graph of FIG. 8A plots the total phase delay of the NMOS transistor obtained from the simulations, wherein it can be seen that the phase delay increases approximately in proportion to the operating frequency. From the phasor diagram of FIG. 7, it can be seen that the ratio between $i_{gd}$ and $g_m v_x$ varies for different $g_m$ if a constant gate voltage $v_x$ is assumed. Accordingly, the phase delay of the NMOS transistor depends on the current density, as is verified by the simulation results plotted in the graph of FIG. 8B wherein a lower current density corresponds to a larger phase delay. Additionally, it should be appreciated that the device size also affects the delay owing to the difference in the layout and thus the parasitic resistance, inductance, and capacitance. Embodiments of an RPT oscillator implementation thus optimize the current density as well as the device size to obtain an appropriate negative phase shift $\varphi_0$ for use in providing rotation phase shifts in the two current branches.

RPT oscillator 400 of FIG. 4 comprises differential pair of transistors ($M_{2+}$ and $M_{2-}$) in parallel with a cross-coupled transistor pair ($M_{1+}$ and $M_{1-}$), wherein the transistors (transistors 201a-201d) may be implemented as NMOS transistors. It can be appreciated from the foregoing that the NMOS transistors of such an implementation may be leveraged to provide the negative rotation phase shift $\varphi_0$, or some portion thereof, for use in the two current branches of embodiments of an RPT oscillator herein. For example, NMOS implementations of transistors 201a-201d of embodiments of RPT oscillator 400 may be utilized to provide a negative rotation phase shift of ~22.5° or ~45° for 8-phase and 4-phase N-stage RPT oscillators, wherein RPT oscillator 400 provides the circuit configuration of the multiple oscillator cells of the N-stage RPT oscillators. It should be appreciated that utilizing the transistors of the RPT oscillator circuit to realize implicit phase shifters facilitates embodiments wherein no dedicate phase shifter is needed, and thus both chip area and power consumption can be saved.

Having described PT oscillators and their operation generally above, exemplary implementations will be described with reference to specific oscillator configurations implementing PT techniques, including RPT techniques, to aid in understanding the concepts herein. In particular, two example configurations of E-band RPT oscillators, one with 4-phase output achieving a wide tuning range of 18% from 67.8 to 81.4 GHz and another with 8-phase output measuring low phase noise of −116 to −118 dBc/Hz at 10-MHz offset around 77 GHz, are described below.

Figure 9A:
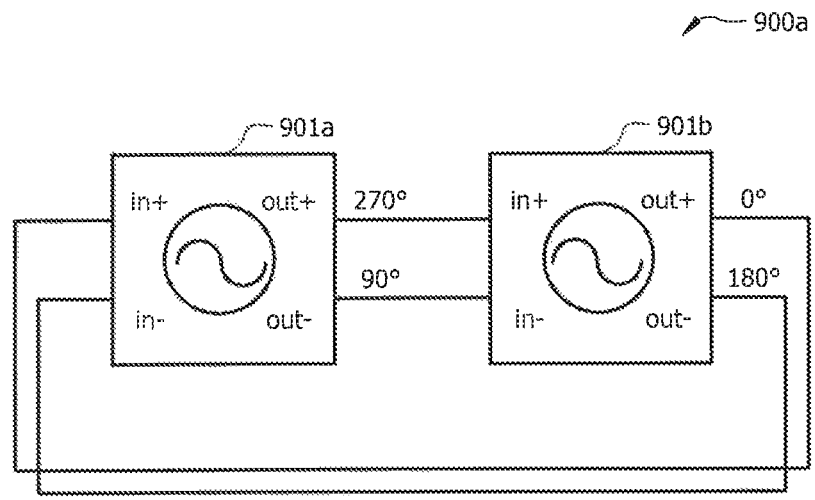
FIGS. 9A and 9B show N-stage RPT ring oscillator implementations in accordance with embodiments of the invention.
Figure 9B:
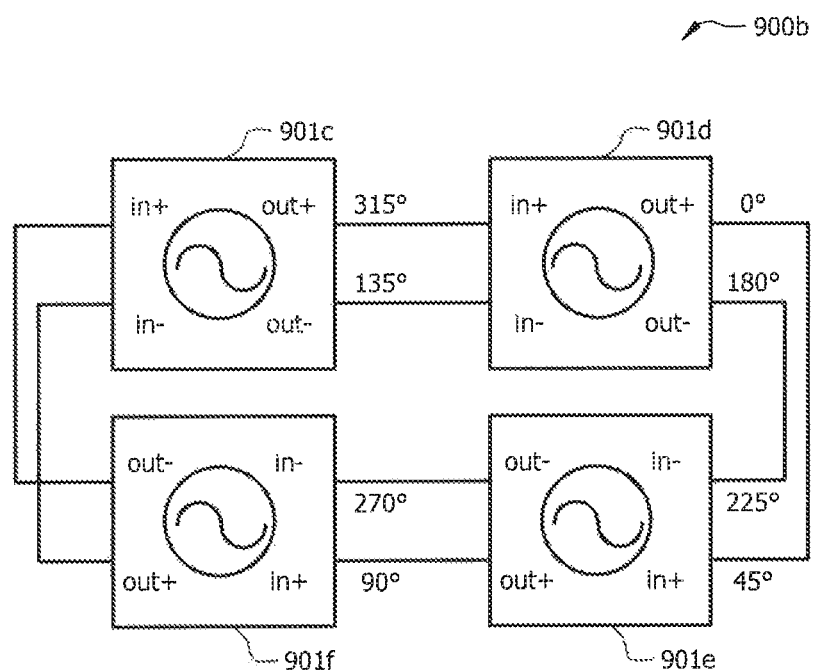
Figure 9C:
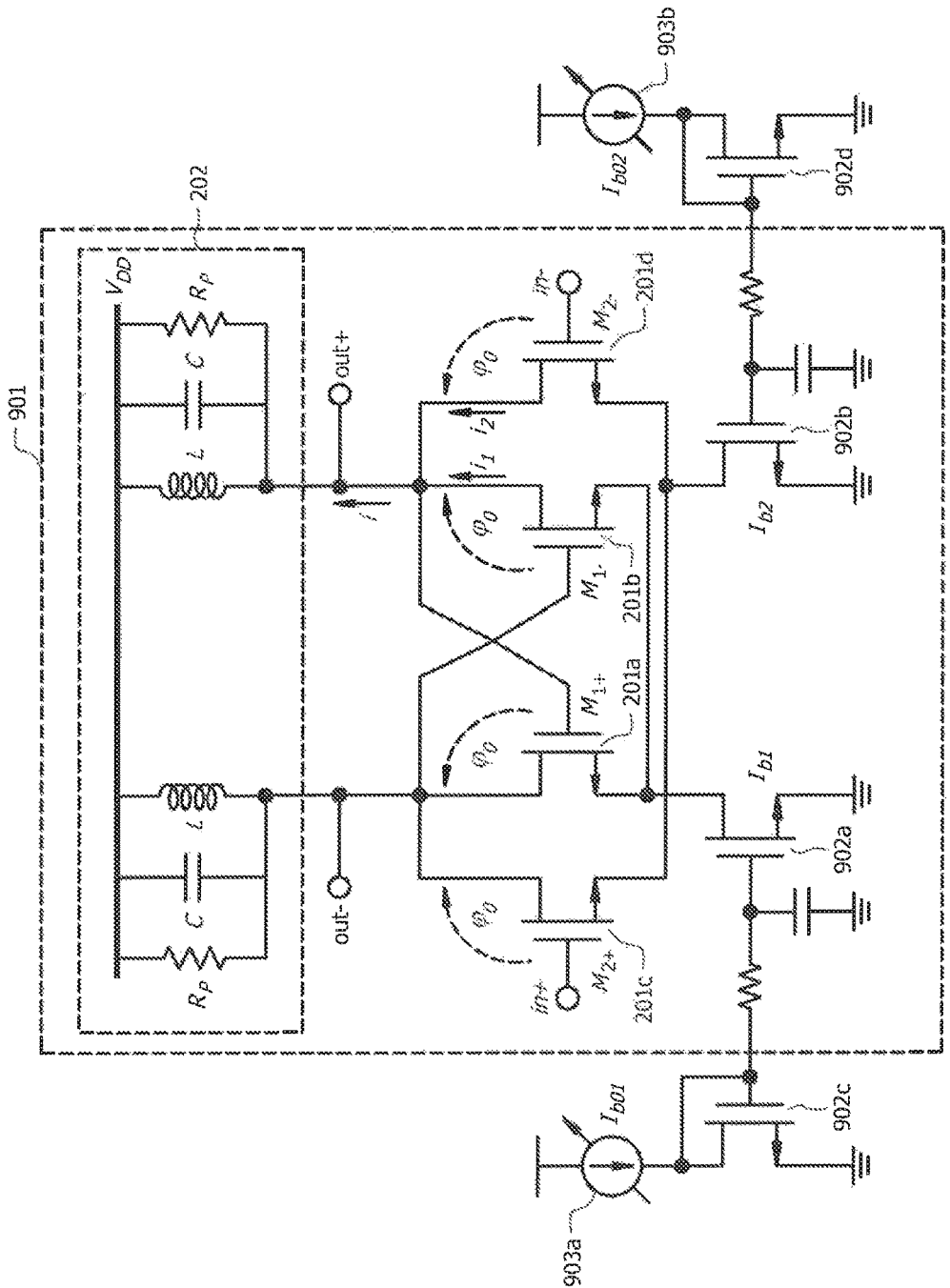
FIG. 9C shows an RPT oscillator cell configuration as may be utilized in the N-stage LC-based RPT ring oscillators of FIGS. 9A and 9B in accordance with embodiments of the invention.

FIGS. 9A and 9B show N-stage RPT ring oscillator implementations providing 4-phase output and 8-phase output, respectively. In particular, FIG. 9A shows an example configuration of a 2-stage (N=2) RPT ring oscillator as RPT ring oscillator 900a in which RPT oscillator cells 901a and 901b are cascaded in a ring configuration to provide 4-phase output. FIG. 9B shows an example configuration of a 4-stage (N=4) RPT ring oscillator as RPT ring oscillator 900b in which RPT oscillator cells 901c-901f are cascaded in a ring configuration to provide 8-phase output. Detail with respect to an exemplary implementation of RPT oscillator cells 901a-901f is shown in FIG. 9C as RPT oscillator cell 901 (e.g., comprising circuitry corresponding to that of RPT oscillator 400 described above). In each stage of the foregoing RPT ring oscillators (i.e., each instance of RPT oscillator cell 901 in the RPT ring oscillator), the cross-coupled transistor pair ($M_{1+}$ and $M_{1-}$) provides the negative resistance and the differential transistor pair ($M_{2+}$ and $M_{2-}$) realizes the coupling to its proceeding stage. In operation of RPT ring oscillators 900a and 900b of embodiments, the intrinsic delay of the RPT oscillator cell transistors ($M_{1+}$, $M_{1-}$, $M_{2+}$, and $M_{2-}$) in each stage is optimized to achieve the desired rotation phase shift $\varphi_0$.

It should be appreciated that, in the exemplary RPT ring oscillator implementations of embodiments, no varactor is used in the LC tanks (LC tank 202) of RPT oscillator cells 901a-901f and the oscillation frequency tuning is relies purely on phase-tuning techniques according to concepts herein, which may be performed by varying the tail currents $I_{b1}$ and $I_{b2}$ to adjust the interpolated phase. For example, a current-mirror configuration may be provided in which transistors 902a and 902b are disposed in the tail current paths of the RPT oscillator cells, wherein all the gates of transistors 902a provided with respect to tail current $I_{b1}$ of each RPT oscillator cell are tied together and connected to current source 903a and current mirror transistor 902c, and correspondingly all the gates of transistors 902b provided with respect to tail current $I_{b2}$ of each RPT oscillator cell are tied together and connected to current source 903b and current mirror transistor 902d. In operation according to embodiments of RPT ring oscillators 900a and 900b, current sources 903a and 903b provide two independently controlled current sources (e.g., independently providing currents $I_{b01}$ and $I_{b02}$). By using such a current-mirror configuration, all of the tail currents (e.g., $I_{b1}$ and $I_{b2}$) in each RPT oscillator cell can be varied at the same time by tuning the respective current sources (e.g., providing $I_{b01}$ and $I_{b02}$).

To aid in understanding the properties of RPT ring oscillators 900a and 900b of embodiments, oscillation conditions for exemplary RPT oscillator cells (e.g., RPT oscillator cell 901) used therein are described below. It should be appreciated that, in the vicinity of the resonance frequency $\omega_0$, the impedance of the LC tank in each RPT oscillator cell (e.g., LC tank 202 of RPT oscillator cell 901) can be approximated as:

$$Z(\omega) \approx \frac{R_P}{1 + \frac{j2Q(\omega - \omega_0)}{\omega_0}} \quad (2)$$

where $R_P$ represents the equivalent parallel resistance and Q is the quality factor. The phase shift of the LC tank may thus be derived as:

$$\angle Z(\omega) \approx -\arctan \frac{2Q(\omega - \omega_0)}{\omega_0}. \quad (3)$$

The total current injected to the LC tank at the frequency $\omega$ can be derived according to:

$$i_t = (|i_1| \cos \varphi_1 + |i_2| \cos \varphi_2) + j(|i_1| \sin \varphi_1 + |i_2| \sin \varphi_2) \quad (4)$$

where $\varphi_1$ and $\varphi_2$ denote the phase of the currents $i_1$ and $i_2$ that are generated by the cross-coupled transistors ($M_{1+}$ and $M_{1-}$) and the differential transistors ($M_{2+}$ and $M_{2-}$), respectively. From the foregoing, the interpolated phase $\varphi$ providing the tuning phase shift can be expressed as:

$$\varphi = \arctan\left(\frac{|i_1|\sin\varphi_1 + |i_2|\sin\varphi_2}{|i_1|\cos\varphi_1 + |i_2|\cos\varphi_2}\right). \quad (5)$$

It should be appreciated that the multi-phase oscillator configurations should fulfill both the gain and the phase conditions simultaneously in order to sustain stable oscillation. The phase condition provides that the total phase shift along the loop be 0, as represented by:

$$\angle Z(\omega) + \varphi = 0. \quad (6)$$

By substituting the two terms in equation (6) with the corresponding equations (3) and (5), the oscillation frequency can be derived as:

$$\omega \approx \omega_0 \cdot \left(1 + \frac{|i_1|\sin\varphi_1 + |i_2|\sin\varphi_2}{|i_1|\cos\varphi_1 + |i_2|\cos\varphi_2} \cdot \frac{1}{2Q}\right). \quad (7)$$

The gain condition indicates that the voltage gain of each oscillator cell should be at least unity gain. By multiplying equation (2) with equation (4) and using equation (6), the gain of the oscillator cells may be derived as follows:

$$|i_d||Z(\omega)| = (|i_1|\cos\varphi_1 + |i_2|\cos\varphi_2) \cdot R_P \geq 1. \quad (8)$$

As can be appreciated from the foregoing, the gain and phase conditions may be fulfilled in operation of RPT oscillator cell 901 of embodiments to thereby provide stable oscillation.

Implementations of RPT ring oscillators according to embodiments herein provide a relatively wide oscillation frequency tuning range. In understanding the oscillation frequency tuning range provided by operation of RPT ring oscillator implementations of embodiments, the portion of $|i_2|$ in the overall current $(|i_1|+|i_2|)$, referred to herein as m, may be defined to be $|i_2|/(|i_1|+|i_2|)$ such that the oscillation frequency expressed in equation (7) can be rewritten as follows:

$$\omega \approx \omega_0 \cdot \left(1 + \frac{\frac{1-m}{m}\sin\varphi_1 + \sin\varphi_2}{\frac{1-m}{m}\cos\varphi_1 + \cos\varphi_2} \cdot \frac{1}{2Q}\right) \quad (9)$$

Figure 10:
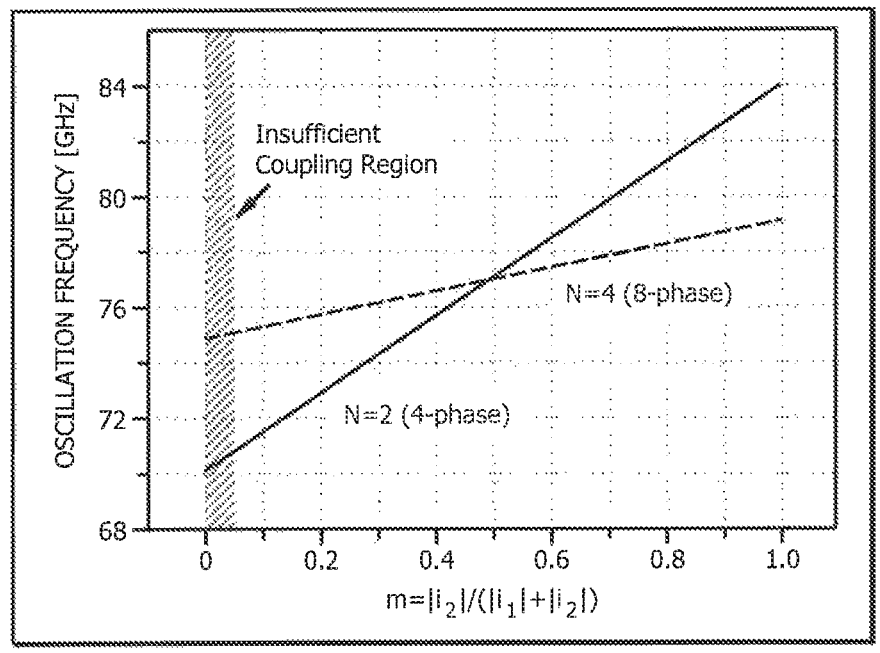
FIG. 10 shows graphs plotting frequency versus current ratio for the 4-phase RPT ring oscillator and the 8-phase RPT ring oscillator of FIGS. 9A and 9B of embodiments of the invention.

From equation (9), it can be appreciated that the oscillation frequency of the RPT oscillator cells may be tuned by varying m. If hard switching is assumed for the transistors of the cross-coupled transistor pair ($M_{1+}$ and $M_{1-}$) and the differential transistor pair ($M_{2+}$ and $M_{2-}$), such that their output currents are square waves, then $i_1=2I_{b1}/\pi$ and $i_2=2I_{b2}/\pi$ such that m is also equal to $I_{b2}/(I_{b1}+I_{b2})$. Accordingly, oscillation frequency tuning can be achieved by adjusting the tail current ratio. In operation according to embodiments, the oscillation frequency varies monotonically with m as shown in FIG. 10. In particular, the graph of FIG. 10 shows graphs plotting the frequency versus m from calculations using equation (9) for the 4-phase oscillator of RPT ring oscillator 900a and the 8-phase oscillator of RPT ring oscillator 900b, in which $\varphi_1 = -\varphi_2$ is assumed to be 45° and 22.5° while Q is assumed to be 5.5 and 7.5, respectively.

As discussed above, the amplitude ratio $|i_2|/|i_1|$ should be sufficiently large for strong coupling between neighboring oscillator cells. Accordingly, the RPT oscillator cells of embodiments should not be operated in the region where m (i.e., $m=|i_2|/(|i_1|+|i_2|)$) is too small, as shown by the hashed area in FIG. 10, to ensure sufficient coupling for oscillating as a ring.

Assuming m to be continuously variable from 0 to 1 for simplicity, the maximum oscillation frequency tuning range ($TR_{max}$) of RPT oscillator cells of embodiments herein can be approximated as:

$$TR_{max} \leq \frac{\omega_{max} - \omega_{min}}{\omega_0} \approx \quad (10)$$
$$(\tan\varphi_2 - \tan\varphi_1) \cdot \frac{1}{2Q} = \left[\tan\varphi_2 - \tan\left(\varphi_2 - \frac{180°}{N}\right)\right] \cdot \frac{1}{2Q}$$

Figure 11:
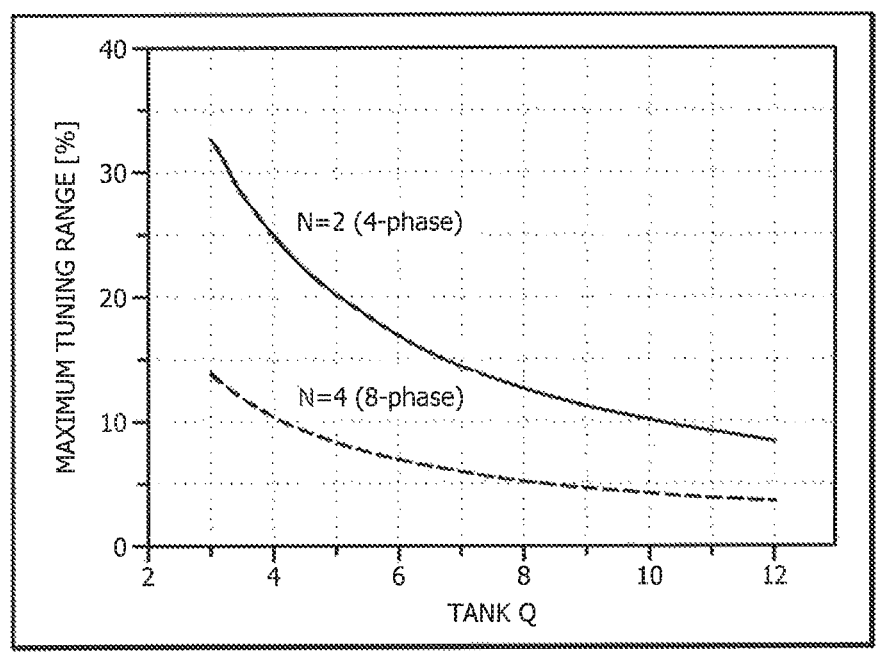
FIG. 11 shows graphs plotting the maximum frequency tuning range for the 4-phase RPT ring oscillator and the 8-phase RPT ring oscillator of FIGS. 9A and 9B of embodiments of the invention.

As can be appreciated from equation (10), the oscillation frequency tuning range is inversely proportional to the quality factor. Moreover, the oscillation frequency tuning range reduces with increasing of the number of stages in an RPT ring oscillator configuration, assuming that the gain condition expressed in equation (8) is satisfied, as shown in FIG. 11. In particular, FIG. 11 shows graphs plotting the maximum oscillation frequency tuning range calculated from equation (10) for both the 4-phase oscillator of RPT ring oscillator 900a and the 8-phase oscillator of RPT ring oscillator 900b, where $\varphi_2$ is set to 90°/N such that the RPT is optimal. It should be appreciated that, by equating $\partial TR_{max}/\partial \varphi_2$ to 0, $\varphi_2=90°/N$ corresponds to a minimum value of $TR_{max}$. Therefore, in the presence of some phase errors which inevitably exist in real implementations, the oscillation frequency tuning range could be larger, although the aforementioned gain condition may become a concern if $\varphi_2$ deviates from 90°/N too much.

As previously discussed, there is a performance trade-off between the oscillation frequency tuning range and the phase noise of an oscillator configuration implementing variable tuning phase shifts according to embodiments. Accordingly, embodiments of RPT ring oscillators herein are configured to minimize the negative effect on the phase noise associated with the oscillation frequency tuning range.

In understanding the phase noise associated with embodiments of an RPT ring oscillator, it should be appreciated that the multiple oscillator stages used in an N-stage oscillator results in an increase of the total noise power by N (i.e., the number of noise sources is N times as that in a single-stage oscillator). However, the presence of N LC tanks attenuate the noise by a factor of $N^2$. Accordingly, an N-stage LC oscillator theoretically features overall phase noise improvement of $10 \log_{10} N$ dB compared with a single-stage oscillator, see P. Andreani, and X. Wang, "On the phase-noise and phase-error performances of multiphase LC CMOS VCOs," *IEEE J. Solid-State Circuits*, vol. 39, no. 11, pp. 1883-1893, November 2004, the disclosure of which is incorporated herein by reference. However, in practice several effects should be also taken into account with respect to the phase noise of RPT ring oscillator implementations. In particular, it should be appreciated that the quality factor of embodiments of an RPT ring oscillator will be lower than the intrinsic quality factor $Q_0$ at the resonance frequency in light of the LC tank providing a phase shift of $\varphi$. From equations (1) and (5), the effective quality factor Q for an RPT ring oscillator of embodiments herein may be written as:

$$Q \approx Q_0 \cdot \left[\frac{|i_1|\cos\varphi_1 + |i_2|\cos\varphi_2}{\sqrt{(|i_1|\sin\varphi_1 + |i_2|\sin\varphi_2)^2 + (|i_1|\cos\varphi_1 + |i_2|\cos\varphi_2)^2}}\right]. \quad (11)$$

Further, RPT ring oscillators may experience some degradation of oscillation amplitude due to the rotated-phase-tuning technique. For example, as can be appreciated from equation (8), the output amplitude of an RPT ring oscillator may be smaller than $|i_1|+|i_2|$ in the presence of phase shift $\varphi_1$ and $\varphi_2$.

Considering the foregoing, the phase noise of an N-stage RPT ring oscillator may be expressed by utilizing the Leeson's equation (see D. B. Leeson, "A simple model of feedback oscillator noise spectrum," *Proc. IEEE*, vol. 54, no. 2, pp. 329-330, February 1966, the disclosure of which is incorporated herein by reference) as follows:

$$\mathcal{L}(\Delta\omega) \approx 10 \log_{10}\left[\frac{kT}{N} \cdot \frac{1}{Q^2} \cdot \frac{\pi^2}{4} \cdot \frac{1}{(|i_{b1}|\cos\varphi_1 + |i_{b2}|\cos\varphi_2)^2 R_P} \cdot \left(\frac{\omega}{\Delta\omega}\right)^2 \cdot (1+F)\right], \quad (12)$$

where k is the Boltzmann constant and F is the excess noise factor to account for the noise contributed by devices other than the LC tanks, see S. Rong, and H. C. Luong, "Design and Analysis of Varactor-Less Interpolative-Phase-Tuning Millimeter-Wave LC Oscillators with Multiphase Outputs," *IEEE J. Solid-State Circuits*, vol. 46, no. 8, pp. 1810-1819, August 2011, the disclosure of which is incorporated herein by reference. Setting $\varphi_1$ and $\varphi_2$ to 90°/N such that the RPT is optimal, as discussed above, equation (12) may be simplified as:

$$\mathcal{L}(\Delta\omega) \approx 10\log_{10}\left[\frac{kT}{N} \cdot \frac{1}{Q^2} \cdot \frac{\pi^2}{4} \cdot \frac{1}{(|i_{b1}| + |i_{b2}|)^2 \cos^2\frac{90°}{N} R_P} \cdot \left(\frac{\omega}{\Delta\omega}\right)^2 \cdot (1+F)\right], \quad (13)$$

It can be appreciated from equation (13) that a high quality factor of the LC tanks may directly help lower the phase noise of the RPT ring oscillator, which is similar to other LC-based oscillators. In addition, more stages in an RPT ring oscillator further benefit the phase noise at the expense of higher power consumption.

Figure 12B:
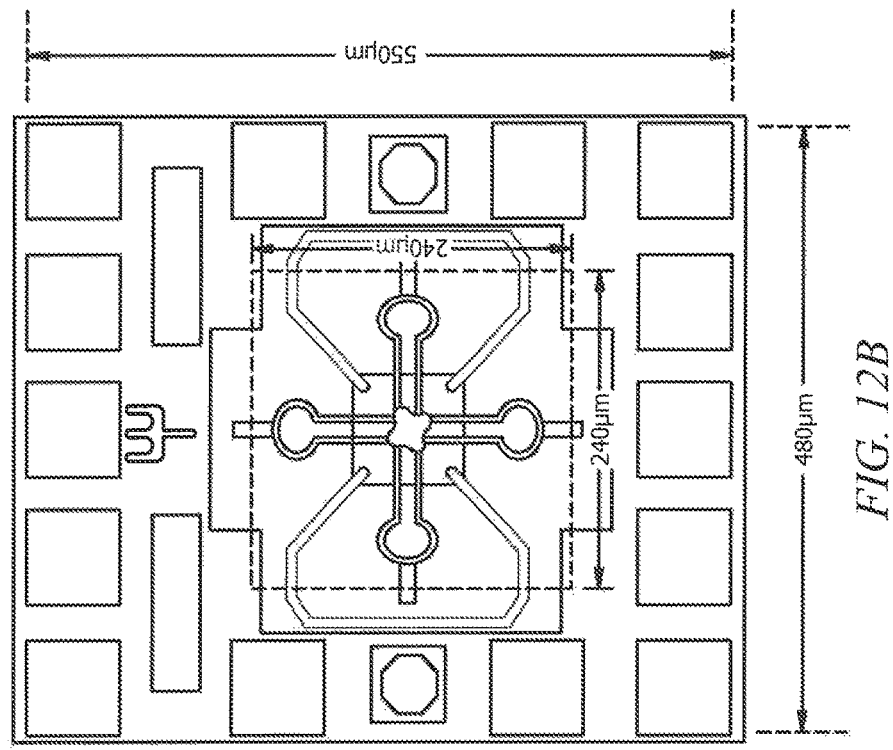
FIGS. 12A and 12B show exemplary plan views of integrated circuit dies comprising the 4-phase RPT ring oscillator and the 9-phase RPT ring oscillator of FIGS. 9A and 9B of embodiments of the invention.
Figure 12A:
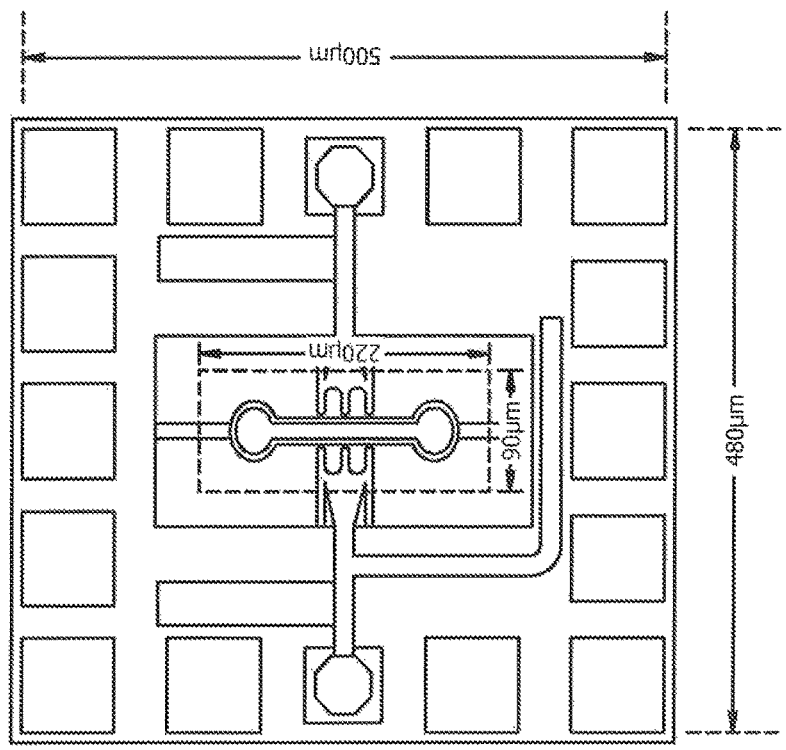

Referring again to the N-stage LC-based RPT ring oscillator implementations of FIGS. 9A and 9B, RPT ring oscillator 900a providing 4-phase output and RPT ring oscillator 900b providing 8-phase output may be implemented according to embodiments in a 65-nm CMOS process. FIGS. 12A and 12B show exemplary plan views of integrated circuit dies comprising embodiments of RPT ring oscillator 900a and RPT ring oscillator 900b, respectively, as may be provided using the aforementioned CMOS process. As shown in FIG. 12A, exemplary RPT ring oscillator 900a occupies a core area of 0.09×0.22 mm² and, as shown in FIG. 12B, RPT ring oscillator 900b occupies a core area of 0.24×0.24 mm², each excluding pads. It should be appreciated that, for testing purpose, open-drain buffers are included in the exemplary RPT ring oscillators of FIGS. 12A and 12B to route the mmW signals out and to drive the input impedance of the equipment.

Integrated circuit dies corresponding to those illustrated in FIGS. 12A and 12B have been produced for testing RPT ring oscillators implemented in accordance with the concepts of the present invention. All measurements with respect to these test implementations discussed below were performed in chip-on-board assemblies, with the mmW outputs observed by on-wafer probing while the DC and low-frequency pads directly wire-bonded to the printed circuit board (PCB). For spectrum and phase noise measurement, an external balanced mixer (Millitech MXB-12-RR-2AF) and a signal analyzer (Keysight PXA N9030B) were used.

Figure 13A:
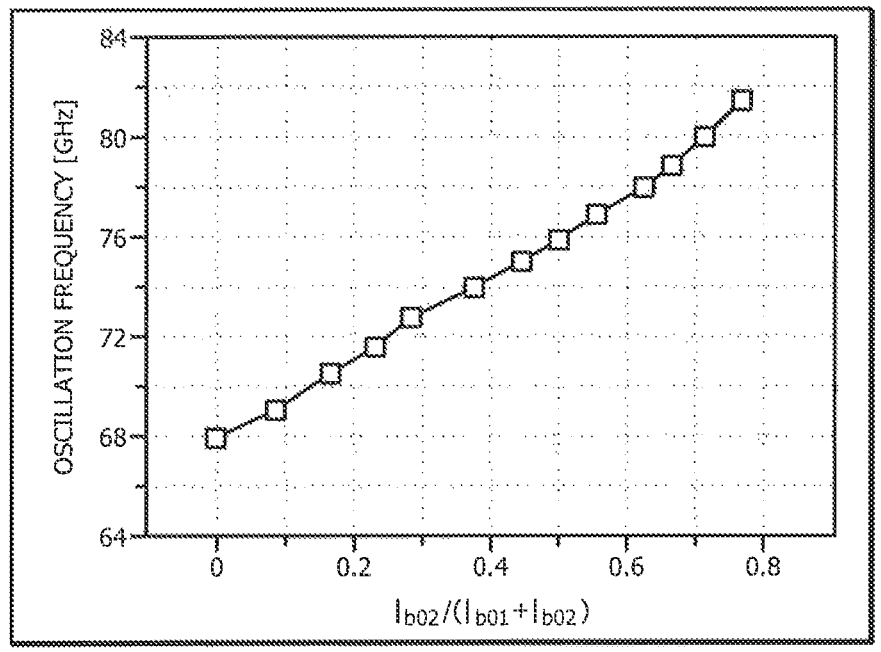
FIGS. 13A and 13B show graphs plotting the measured frequency tuning curves for the exemplary RPT ring oscillator implementations of FIGS. 12A and 12B of embodiments of the invention.
Figure 13B:
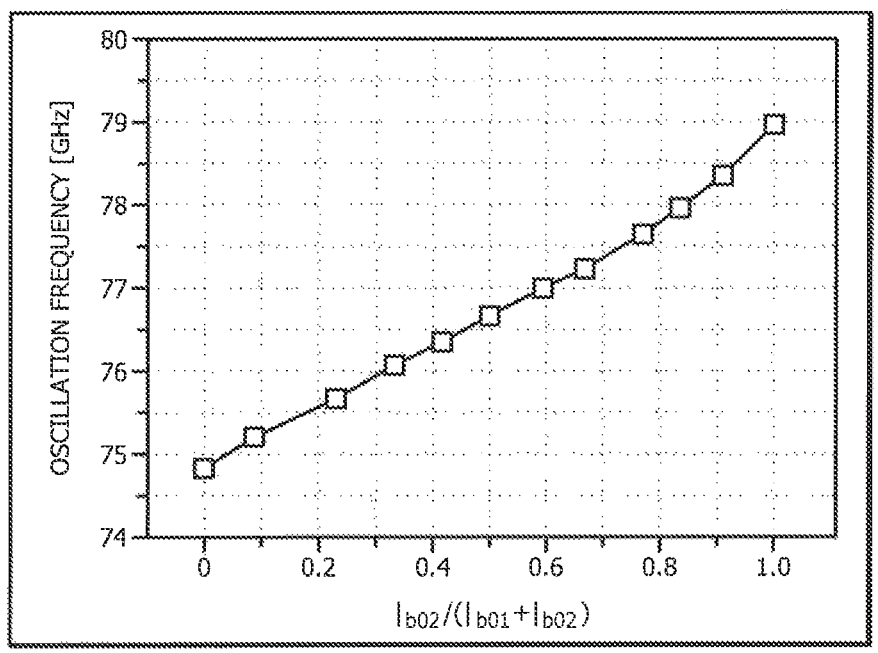

FIGS. 13A and 13B show graphs plotting the measured oscillation frequency tuning curves for the exemplary RPT ring oscillator implementations of FIGS. 12A and 12B. In particular, FIG. 13A shows a plot of the measured oscillation frequency tuning curve for the 4-phase RPT ring oscillator implementation of FIG. 12A and FIG. 13B shows a plot of the measured oscillation frequency tuning curve for the 8-phase RPT ring oscillator implementation of FIG. 12B. In the illustrated example, the oscillation frequency of the 4-phase RPT ring oscillator implementation of FIG. 12A was tuned continuously from 67.8 to 81.4 GHz as the bias current ratio $I_{b02}/(I_{b01}+I_{b02})$ was varied from 0 to 0.8. The oscillation frequency of the 8-phase RPT ring oscillator implementation of FIG. 12B was tuned from 74.8 to 79 GHz with the bias current ratio varied from 0 to 1. It should be appreciated that when the bias current $I_{b02}$ is 0, there is still some current flowing through the tail current $I_{b2}$ due to the non-negligible leakage in nanoscale transistors. However, as long as the coupling strength is sufficient, and thus the oscillator stages are able to injection-lock each other to output a single frequency tone, $I_{b02}=0$ may be allowed. The upper limit on the current ratio in the exemplary RPT ring oscillator implementations is determined by whether the gain condition can be satisfied. Accordingly, $I_{b01}$ should not be arbitrarily small (e.g., such that the maximum current ratio cannot exceed 0.8) for the 4-phase RPT ring oscillator implementation of FIG. 12A.

Figure 14A:
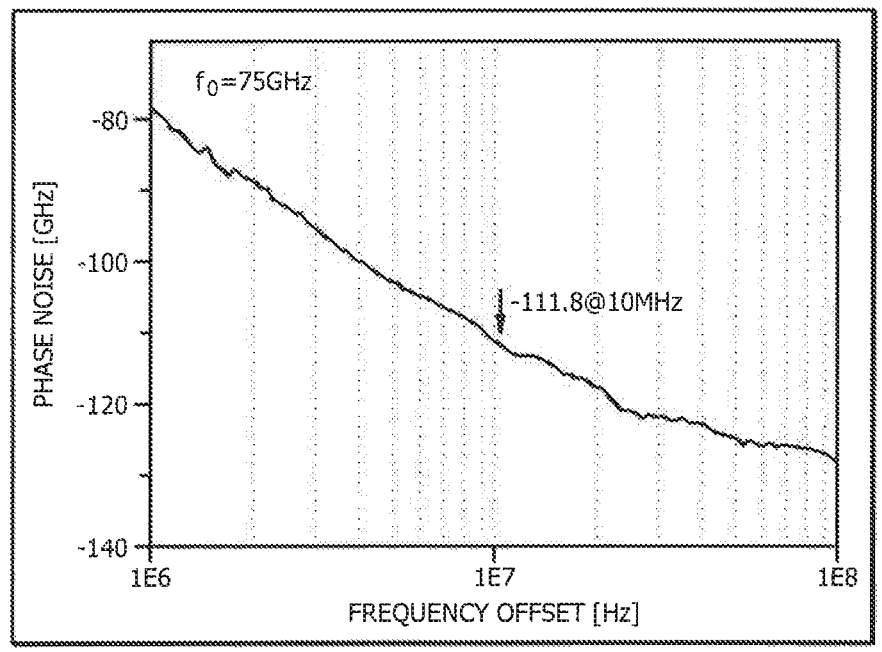
FIGS. 14A, 14B, 15A, and 15B show graphs plotting the measured phase noise for the exemplary RPT ring oscillator implementations of FIGS. 12A and 12B of embodiments of the invention.
Figure 14B:
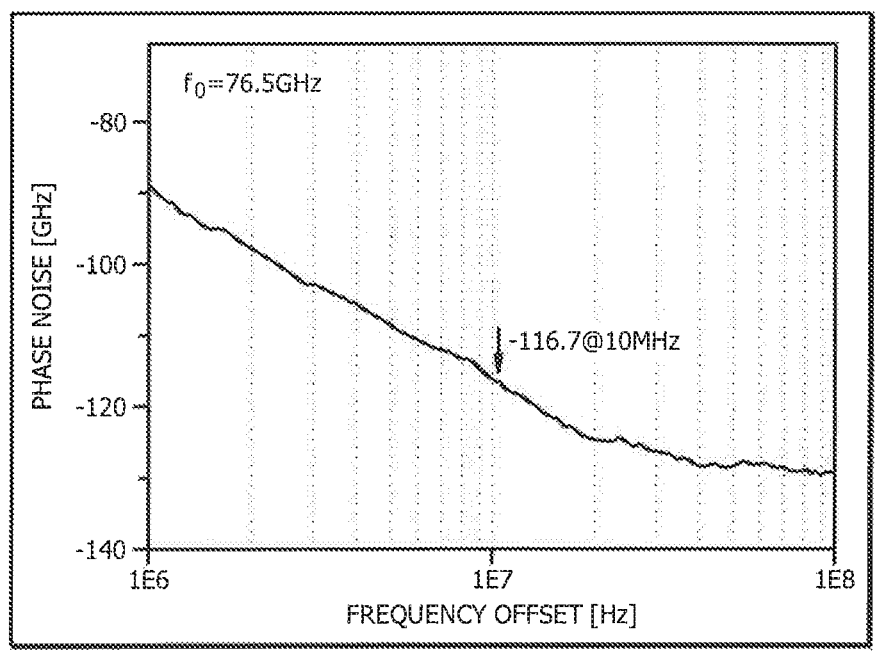
Figure 15A:
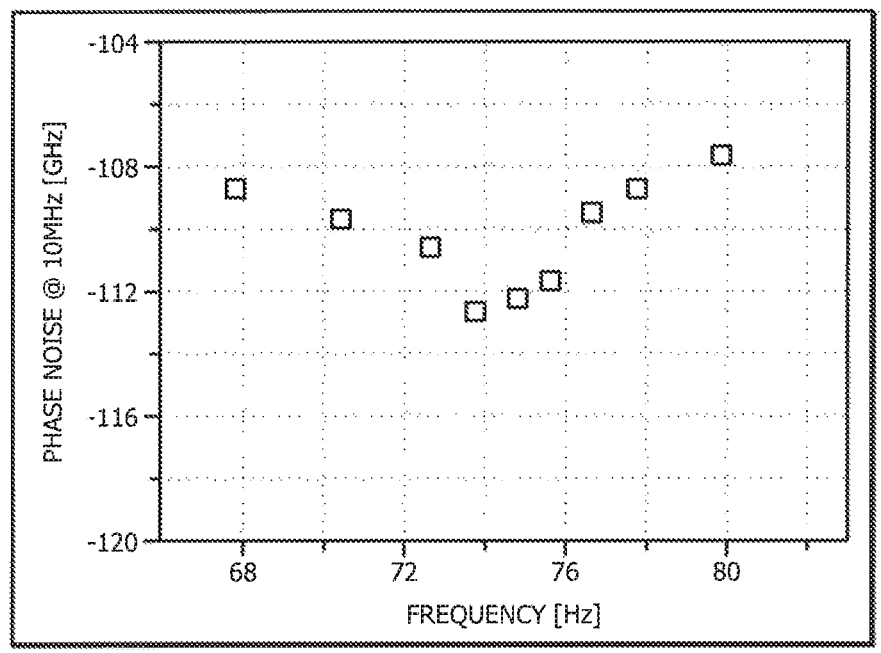
Figure 15B:
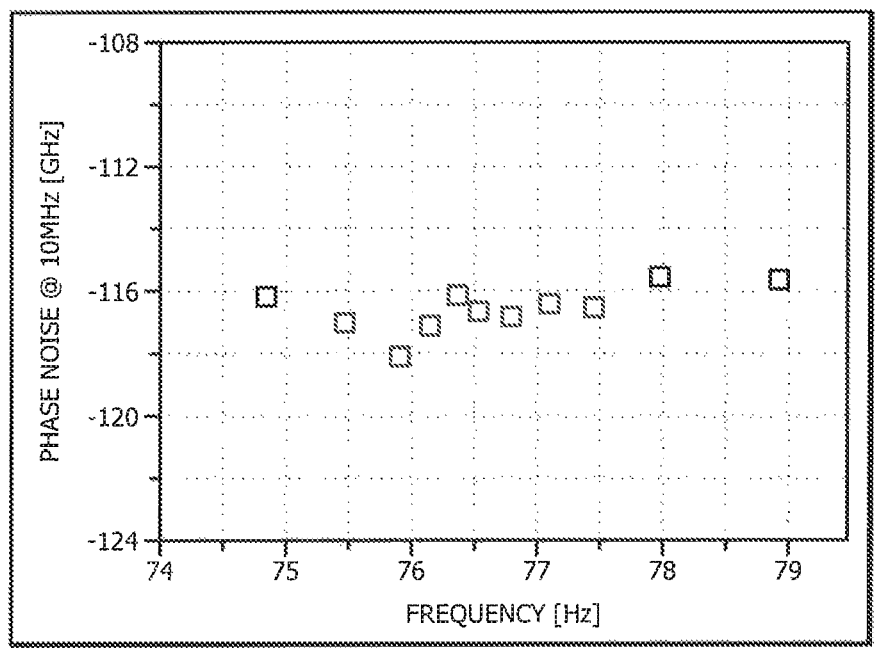

FIGS. 14A and 14B show graphs plotting the measured phase noise for the exemplary RPT ring oscillator implementations of FIGS. 12A and 12B. In particular, FIG. 14A shows a plot of the measured phase noise for the 4-phase RPT ring oscillator implementation of FIG. 12A at 75 GHz and FIG. 14B shows a plot of the measured phase noise for the 8-phase RPT ring oscillator implementation of FIG. 12B at 76.5 GHz. FIGS. 15A and 15B show graphs plotting the measured phase noise at 10 MHz offset verses oscillation frequency, wherein FIG. 15A shows the plot for the 4-phase RPT ring oscillator implementation and FIG. 15B shows the plot for the 8-phase RPT ring oscillator implementation. As can be appreciated from the phase noise plots of FIGS. 15A and 15B, throughout the entire tunable oscillation frequency ranges the phase noise at 10 MHz offset frequency for the RPT ring oscillators of the exemplary implementations measures from −108 to −113 dBc/Hz (4-phase RPT ring oscillator of FIG. 12A) and from −116 to −118 dBc/Hz (8-phase RPT ring oscillator of FIG. 12B).

In operation, the exemplary RPT ring oscillators both consume similar DC power. In particular, the both exemplary RPT ring oscillator implementations were measured as consuming 13 to 25 mW from 1-V supply.

The table below summarizes the measured performance of the exemplary RPT ring oscillator implementations of FIGS. 12A and 12B. The figure-of-merit (FoM) metric provided in the performance summary characterize the overall performance of the RPT ring oscillators in terms of oscillation frequency, phase noise, and power consumption, while the $FoM_T$ and $FoM_A$ metrics additionally take the oscillation frequency tuning range and the chip area into account, respectively. These figure-of-merit metrics may be computed according to the following:

$$FoM = 10\log_{10}\left[\left(\frac{f_0}{\Delta f}\right)^2 \frac{1}{\mathcal{L}(\Delta f) \cdot P_{diss|mW}}\right]; \quad (14)$$

$$FoM_T = FoM + 20\log_{10}\left(\frac{TR|_\%}{10}\right); \text{ and} \quad (15)$$

$$FoM_A = FoM - 10\log_{10}(A|_{mm^2}), \quad (16)$$

where $f_0$ is the oscillation frequency, $\mathcal{L}(\Delta f)$ is the phase noise at frequency offset of $\Delta f$, $P_{diss|mW}$ is the dissipated power in mW, $TR|_\%$ is the tuning range in percentage, and $A|_{mm^2}$ is the occupied core area in $mm^2$.

| | | | | | | | | | |
|---|---|---|---|---|---|---|---|---|---|
| RPT Ring Oscillator Performance Summary | | | | | | | | | |
| $f_{min}$ [GHz] | $f_{max}$ [GHz] | Tuning Range [GHz/%] | Output Phases | Phase Noise [dBc/Hz] | Power [mW] | Core Area [mm$^2$] | FoM [dB] | FoM$_T$ [dB] | FoM$_A$ [dB] |
| 67.8 | 81.4 | 13.6/18.2 | 4 | −108/−113 @10 MHz | 13 to 25 | 0.02 | 173/178 | 178/183 | 190/195 |
| 74.8 | 79.0 | 4.2/5.5 | 8 | −116/−118 @10 MHz | 13 to 25 | 0.06 | 180/183 | 175/178 | 193/196 |

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for tuning an oscillation frequency of an oscillator, the method comprising:
   rotating a phase of each of two current vectors having different phases provided by two current branches of a differential inductance and capacitance (LC) oscillator circuit in their respective current branches to provide two phase rotated current vectors;
   employing phase interpolation to vary a tuning phase shift in a feedback loop of a differential inductance and capacitance (LC) oscillator circuit, wherein the phase interpolation superimposes the two phase rotated current vectors and provides a resultant current vector having the tuning phase shift; and
   controlling the oscillation frequency of the differential LC oscillator circuit by injecting the resultant current vector having the tuning phase shift into a LC tank of the differential LC oscillator circuit.

2. The method of claim 1, wherein the employing phase interpolation to vary the tuning phase shift comprises:
   advancing, by a first current branch of the two current branches, a phase of a first current vector of the two current vectors; and
   delaying, by a second current branch of the two current branches, a phase of a second current vector of the two current vectors.

3. The method of claim 1, wherein the employing phase interpolation to vary the tuning phase shift comprises:
   controlling an amplitude ratio of the two current vectors in their respective current branches so that the resultant current vector has a selected phase corresponding to the tuning phase shift.

4. The method of claim 3, wherein the controlling the amplitude ratio of the two current vectors comprises:
   independently controlling current sources for the two current branches of the differential LC oscillator circuit providing the two current vectors.

5. The method of claim 1, wherein the rotating the phase of each of the two current vectors comprises:
   providing a negative rotation phase shift in the two current branches of the differential LC oscillator circuit providing the two current vectors.

6. The method of claim 5, wherein the negative rotation phase shift is provided at least in part by a delay contributed by transistors of each current branch of the two current branches.

7. The method of claim 1, wherein the two current branches comprise a first current branch provided by a cross-coupled transistor pair and a second current branch provided by a differential transistor pair in parallel with the cross-coupled transistor pair.

8. The method of claim 1, wherein the two current vectors comprise a first current vector provided by a first current branch of the two current branches with a phase advance and a second current vector provided by a second current branch of the two current branches with a phase lag.

9. The method of claim 1, wherein the oscillator comprises a ring oscillator and the differential LC oscillator circuit comprises an oscillator cell of the ring oscillator.

10. The method of claim 9, wherein a phase difference of the different phases of the two current vectors is 90°.

11. The method of claim 10, wherein the phase difference is implemented by coupling 4 oscillator cells to form an 8-phase ring oscillator.

12. The method of claim 9, wherein a phase difference of the different phases of the two current vectors is 45°.

13. The method of claim 12, wherein the phase difference is implemented by coupling 2 oscillator cells to form a 4-phase oscillator.

14. A system for tuning an oscillation frequency of an oscillator, the system comprising:
   a first current branch of a differential inductance and capacitance (LC) oscillator circuit providing a first current vector of two current vectors used in employing phase interpolation to vary a tuning phase shift in a feedback loop of the differential LC oscillator circuit, wherein the first current branch is configured to rotate a phase of the first current vector; and a second current branch of the differential LC oscillator circuit providing a second current vector of the two current vectors used in employing phase interpolation to vary the tuning phase shift in the feedback loop of the differential LC oscillator circuit, wherein the first phase vector and second phase vector have different phases configured to provide a phase interpolation resultant current vector having the tuning phase shift, wherein the second current branch is configured to rotate a phase of the second current vector and a phase shift of the phase rotation provided by the first and second current branches is configured to prevent oscillation frequency phase ambiguity; and an LC tank of the differential LC oscillator circuit into which the phase interpolation resultant current vector having the tuning phase shift is injected to control the oscillation frequency of the oscillator.

15. The system of claim 14, wherein the a first current branch is configured to advance a phase of the first current vector with respect to a phase of the second current vector, and wherein the a second current branch is configured to delay the phase of the second current vector with respect to the phase of the first current vector.

16. The system of claim 14, further comprising:
a first variable current source configured to control the first current vector within the first current branch; and
a second variable current source configured to control the second current vector within the second current branch.

17. The system of claim 16, wherein the first and second variable current sources are independently adjustable to control an amplitude ratio of the first and second current vectors in their respective current branches so that the phase interpolation resultant current vector has a selected phase corresponding to the tuning phase shift.

18. The system of claim 14, wherein a phase shift of the phase rotation provided by the first and second current branches comprises a negative rotation phase shift.

19. The system of claim 18, wherein the negative rotation phase shift is provided at least in part by a delay contributed by transistors of each current branch of the first and second current branches.

20. The system of claim 14, wherein the first current branch comprise a current branch provided by a cross-coupled transistor pair and the second current branch comprises a current branch provided by a differential transistor pair in parallel with the cross-coupled transistor pair.

21. The system of claim 14, wherein the oscillator comprises a ring oscillator and the differential LC oscillator circuit comprises an oscillator cell of the ring oscillator.

22. The system of claim 21, wherein a phase difference of the different phases of the first and second current vectors is 90°.

23. The system of claim 22, wherein the phase difference is implemented by coupling 4 oscillator cells to form an 8-phase ring oscillator.

24. The system of claim 21, wherein a phase difference of the different phases of the first and second current vectors is 45°.

25. The system of claim 24, wherein the phase difference is implemented by coupling 2 oscillator cells to form a 4-phase oscillator.

26. A system for tuning an oscillation frequency of an oscillator, the system comprising:
a first current branch of a differential inductance and capacitance (LC) oscillator circuit providing a first current vector of two current vectors used in employing phase interpolation to vary a tuning phase shift in a feedback loop of the differential LC oscillator circuit, wherein the first current branch is configured to rotate a phase of the first current vector; and a second current branch of the differential LC oscillator circuit providing a second current vector of the two current vectors used in employing phase interpolation to vary the tuning phase shift in the feedback loop of the differential LC oscillator circuit, wherein the first current vector and the second current vector have different phases configured to provide a phase interpolation resultant current vector having the tuning phase shift, wherein the second current branch is configured to rotate a phase of the second current vector and a phase shift of the phase rotation provided by the first and second current branches is configured to prevent oscillation frequency phase ambiguity;

a first variable current source configured to control an amplitude of the first current vector within the first current branch;

a second variable current source configured to control an amplitude of the second current vector within the second current branch, wherein the first variable current source and the second variable current source are configured to provide control of a phase of the phase interpolation resultant current vector having the tuning phase shift; and an LC tank of the differential LC oscillator circuit into which the phase interpolation resultant current vector having the tuning phase shift is injected to control the oscillation frequency of the oscillator.

27. The system of claim 26, wherein the a first current branch is configured to advance a phase of the first current vector with respect to a phase of the second current vector, and wherein the a second current branch is configured to delay the phase of the second current vector with respect to the phase of the first current vector.

28. The system of claim 26, wherein the phase rotation is provided at least in part by a delay contributed by transistors of each current branch of the first and second current branches.

29. The system of claim 26, wherein the first current branch comprise a current branch provided by a cross-coupled transistor pair and the second current branch comprises a current branch provided by a differential transistor pair in parallel with the cross-coupled transistor pair.

* * * * *

UNITED STATES PATENT AND TRADEMARK OFFICE
CERTIFICATE OF CORRECTION

PATENT NO. : 10,382,015 B2
APPLICATION NO. : 15/611496
DATED : August 13, 2019
INVENTOR(S) : Quan Xue et al.

Page 1 of 1

It is certified that error appears in the above-identified patent and that said Letters Patent is hereby corrected as shown below:

In the Specification

At Column 13, Line number 18, equation 12, delete the portion of the equation reading "$(|i_{b1}|\cos\varphi_1 + |i_{b2}|\cos\varphi_2)^2$" and replace with --$(|I_{b1}|\cos\varphi_1 + |I_{b2}|\cos\varphi_2)^2$--.

At Column 13, Line number 36, equation 13, delete the portion of the equation reading "$(|i_{b1}| + |i_{b2}|)^2$" and replace with --$(|I_{b1}| + |I_{b2}|)^2$--.

Signed and Sealed this
Twenty-sixth Day of November, 2019

Andrei Iancu
*Director of the United States Patent and Trademark Office*